(12) United States Patent
Shiokawa

(10) Patent No.: US 11,257,533 B2
(45) Date of Patent: Feb. 22, 2022

(54) MAGNETIC MEMORY AND METHOD FOR CONTROLLING THE SAME

(71) Applicant: TDK CORPORATION, Tokyo (JP)

(72) Inventor: Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/921,211

(22) Filed: Jul. 6, 2020

(65) Prior Publication Data

US 2021/0012820 A1 Jan. 14, 2021

(30) Foreign Application Priority Data

Jul. 10, 2019 (JP) .............................. JP2019-128453

(51) Int. Cl.
| | |
|---|---|
| *G11C 11/00* | (2006.01) |
| *G11C 11/16* | (2006.01) |
| *H01L 43/04* | (2006.01) |
| *H01L 43/10* | (2006.01) |
| *H01L 43/08* | (2006.01) |

(52) U.S. Cl.
CPC ............ *G11C 11/161* (2013.01); *H01L 43/04* (2013.01); *H01L 43/08* (2013.01); *H01L 43/10* (2013.01)

(58) Field of Classification Search
CPC ....... G11C 11/161; H01L 43/04; H01L 43/08; H01L 43/10
See application file for complete search history.

(56) References Cited

U.S. PATENT DOCUMENTS

| | | | |
|---|---|---|---|
| 8,350,347 B2 | 1/2013 | Gaudin et al. | |
| 2011/0129691 A1 | 6/2011 | Ishiwata et al. | |
| 2014/0056060 A1 | 2/2014 | Khvalkovskiy et al. | |
| 2014/0252439 A1 | 9/2014 | Guo | |
| 2014/0312441 A1 | 10/2014 | Guo | |
| 2015/0036415 A1 | 2/2015 | Di Pendina et al. | |
| 2015/0348606 A1 | 12/2015 | Buhrman et al. | |
| 2016/0365509 A1* | 12/2016 | Saida ................... | G11C 11/1693 |
| 2017/0077394 A1* | 3/2017 | Saida ..................... | H01L 43/08 |

(Continued)

FOREIGN PATENT DOCUMENTS

| | | | |
|---|---|---|---|
| JP | 2014-45196 | A | 3/2014 |
| JP | 5441005 | B2 | 3/2014 |

(Continued)

OTHER PUBLICATIONS

Y.K. Kato, et al. "Observation of the Spin Hall Effect in Semiconductors." Science, vol. 306., 1910-1913 pp., Dec. 10, 2004.

(Continued)

*Primary Examiner* — Toan K Le
(74) *Attorney, Agent, or Firm* — Oliff PLC

(57) ABSTRACT

A magnetic memory includes a storage element including a first ferromagnetic layer, a first conductive layer which faces the first ferromagnetic layer in a first direction and extends in a second direction different from the first direction, and a first conductive part and a second conductive part which are connected to the first conductive layer at positions which sandwich the first ferromagnetic layer in the second direction when seen in the first direction; and a plurality of first switching elements which are electrically connected to the first conductive part of the storage element.

16 Claims, 23 Drawing Sheets

(56) References Cited

U.S. PATENT DOCUMENTS

| | | | |
|---|---|---|---|
| 2017/0178705 A1* | 6/2017 | Buhrman | G11C 11/161 |
| 2017/0222135 A1 | 8/2017 | Fukami et al. | |
| 2017/0331484 A1 | 11/2017 | Kudo | |
| 2018/0040807 A1* | 2/2018 | Saito | G11C 11/1659 |
| 2018/0190899 A1* | 7/2018 | Kim | H01L 43/02 |
| 2020/0312392 A1* | 10/2020 | Tsumita | H01L 43/10 |

FOREIGN PATENT DOCUMENTS

| | | |
|---|---|---|
| JP | 2017-204833 A | 11/2017 |
| WO | 2016/021468 A1 | 2/2016 |
| WO | 2016/159017 A1 | 10/2016 |

OTHER PUBLICATIONS

Miron, Ioan Mihai et al. "Perpendicular switching of a single ferromagnetic layer induced by in-plane current injection." Nature, vol. 476., 189-194 pp. Aug. 11, 2011.

Liu, Lugiao et al. "Spin torque switching with the giant spin Hall effect of tantalum." Mar. 13, 2012 Accessible at https://arxiv.org/abs/1203.2875.

Liu, Luqiao et al. "Current-Induced Switching of Perpendicularly Magnetized Magnetic Layers Using Spin Torque from the Spin Hall Effect." American Physical Society, 096602-1-096602-5, Aug. 31, 2012.

Lee, Ki-Seung et al. "Threshold current for switching of a perpendicular magnetic layer induced by spin Hall effect." American Institute of Physics, Applied Physics Letters 102, 112410-1-112410-5, Mar. 20, 2013.

Lee, Ki-Seung et al. "Thermally activated switching of perpendicular magnet by spin-orbit spin torque." Applied Physics Letters 104, 072413-1-072413-5, Feb. 21, 2014.

Fukami, Shunsuke et al. "Magnetization switching by spin-orbit torque in an antiferromagnet-ferromagnet bilayer system." Nature Materials, vol. 15., 535-541 pp, May 2016.

S. Fukami et al. "A spin-orbit torque switching scheme with collinear magnetic easy axis and current configuration." Mature Nanotechnology, 1-5, Mar. 21, 2016.

S. Takahashi et al. "Spin injection and detection in magnetic nanostructures." The American Physical Society Physical Review B 67, 052409-1-052409-4, Feb. 2003.

Yeongkyo, Seo et al. "Area-Efficient SOT-MRAM With a Schottky Diode". IEEE Electron Device Letters, vol. 37 No. 8, 982-985 pp, Aug. 8, 2016.

Zhang, Wei et al. "Spin Hall Effects in Metallic Antiferromagnetcs". American Physical Society Physical Review Letters, 196602-1-196602-6, Nov. 7, 2014.

* cited by examiner

MAGNETIC MEMORY AND METHOD FOR CONTROLLING THE SAME

BACKGROUND OF THE INVENTION

Field of the Invention

The present disclosure relates to a magnetic memory and a method for controlling the same.

Priority is claimed on Japanese Patent Application No. 2019-128453, filed Jul. 10, 2019, the content of which is incorporated herein by reference.

Description of Related Art

A giant magnetoresistance (GMR) element including a multilayer film of a ferromagnetic layer and a nonmagnetic layer, a tunneling magnetoresistance (TMR) element using an insulating layer (a tunnel barrier layer, a barrier layer) for an nonmagnetic layer, and the like are known as an element which utilizes a change in a resistance value (a change in magnetoresistance) based on a change in an relative angle of magnetization between two ferromagnetic layers.

In recent years, attention has been focused on an element using a spin orbit torque (SOT) and an element using a displacement of a magnetic domain wall among spin elements using a change in magnetoresistance.

For example, Patent Document 1 describes a magnetic recording element using a spin orbit torque. An SOT is induced by a pure spin current generated by a spin-orbit interaction or the Rashba effect at an interface between different materials. A current for inducing an SOT in the magnetoresistance effect element is caused to flow in a direction intersecting a laminating direction of the magnetoresistance effect element. It is not necessary to cause a current to flow in the laminating direction of the magnetoresistance effect element, and it is expected that such a magnetoresistance effect element will have a long lifespan.

Further, for example, Patent Document 2 describes a magnetic domain wall displacement type magnetic recording element. In a magnetic domain wall displacement type magnetic recording element, a resistance value is changed stepwise by moving the magnetic domain wall in the magnetic recording layer. Multi-value data recording is made possible by changing the resistance value stepwise. Furthermore, it is possible to record data not in a digital manner of "0" or "1" but in an analog manner.

PATENT DOCUMENTS

[Patent Document 1] Japanese Unexamined Patent Application, First Publication No. 2017-204833
[Non-Patent Document 1] Japanese Patent No. 5441005

SUMMARY OF THE INVENTION

In a storage element such as a magnetic recording element using a spin orbit torque or a magnetic domain wall displacement type magnetic recording element, a current path for writing data and a current path for reading data are different from each other. These storage elements require a plurality of switching elements to control each of a read current and a write current. That is, in order to operate one storage element, it is necessary to secure an area for a plurality of switching elements.

The present disclosure has been made in view of the above circumstances and provides a magnetic memory which is able to enhance integration characteristics.

The present disclosure provides the following means to solve the above problems.

(1) A magnetic memory according to a first aspect includes a storage element including a first ferromagnetic layer, a first conductive layer which faces the first ferromagnetic layer in a first direction and extends in a second direction different from the first direction, and a first conductive part and a second conductive part which are connected to the first conductive layer at positions at which they sandwich the first ferromagnetic layer in the second direction when seen in the first direction; and a plurality of first switching elements which are electrically connected to the first conductive part of the storage element.

(2) In the magnetic memory according to an aspect, the number of the first switching elements may be two.

(3) In the magnetic memory according to an aspect, a plurality of storage elements may be provided, a first storage element and a second storage element may be connected to the same plurality of first switching elements, and the first storage element and the second storage element may share the plurality of first switching elements.

(4) In the magnetic memory according to the aspect, the first conductive part of the first storage element and the first conductive part of the second storage element may be the same, and the first storage element and the second storage element may share the first conductive part.

(5) In the magnetic memory according to the aspect, each of the plurality of first switching elements may be a transistor, each of the transistors may have a gate electrode, and a source region and a drain region which sandwich the gate electrode, a third conductive part which is connected over the drain region of each of the transistors may be provided, and the first conductive part of the first storage element and the second storage element may be electrically connected to the third conductive part.

(6) The magnetic memory according to the aspect may include a plurality of storage elements, a common switching element which is connected over the plurality of storage elements, a wiring which connects the common switching element to the plurality of storage elements, and a rectifier which is provided between adjacent storage elements of the wiring.

(7) The magnetic memory according to the aspect may further include a second switching element which is connected to the first ferromagnetic layer, and a maximum rated current value of each of the plurality of first switching elements may be larger than a maximum rated current value of the second switching element.

(8) The magnetic memory according to the aspect may further include a second switching element which is connected to the first ferromagnetic layer, and when seen in the first direction, a length of the second switching element in a third direction which intersects the second direction may be substantially the same as a length of each of the plurality of first switching elements in the third direction.

(9) The magnetic memory according to the aspect may further include a plurality of third switching elements which are electrically connected to the second conductive part of the storage element.

(10) In the magnetic memory according to the aspect, a plurality of storage elements may be provided, and the second conductive part of the second storage element may be connected to the plurality of first switching elements connected to the first storage element.

(11) In the magnetic memory according to the aspect, the first conductive layer may include any one of a metal, an alloy, an intermetallic compound, a metal boride, a metal carbide, a metal silicide, and a metal phosphide which have a function of generating a spin current due to a spin Hall effect when a current flows.

(12) The magnetic memory according to the aspect may further include a second ferromagnetic layer which is located on a side of the first ferromagnetic layer opposite to the first conductive layer, and a nonmagnetic layer which is located between the first ferromagnetic layer and the second ferromagnetic layer.

(13) In the magnetic memory according to the aspect, the first conductive layer may include a ferromagnetic material, and a nonmagnetic layer may be further provided between the first ferromagnetic layer and the first conductive layer.

(14) In a method for controlling a magnetic memory according to a second aspect, current pulses having different current amounts are applied stepwise to a first conductive layer of a storage element including a first ferromagnetic layer, and the first conductive layer which faces the first ferromagnetic layer in a first direction and extends in a second direction different from the first direction.

(15) In the method for controlling a magnetic memory according to the aspect, an application time of a first-stage current pulse may be 5 nsec or more.

The magnetic memory according to the present embodiment can improve integration characteristics.

DETAILED DESCRIPTION OF THE INVENTION

Figure 1:
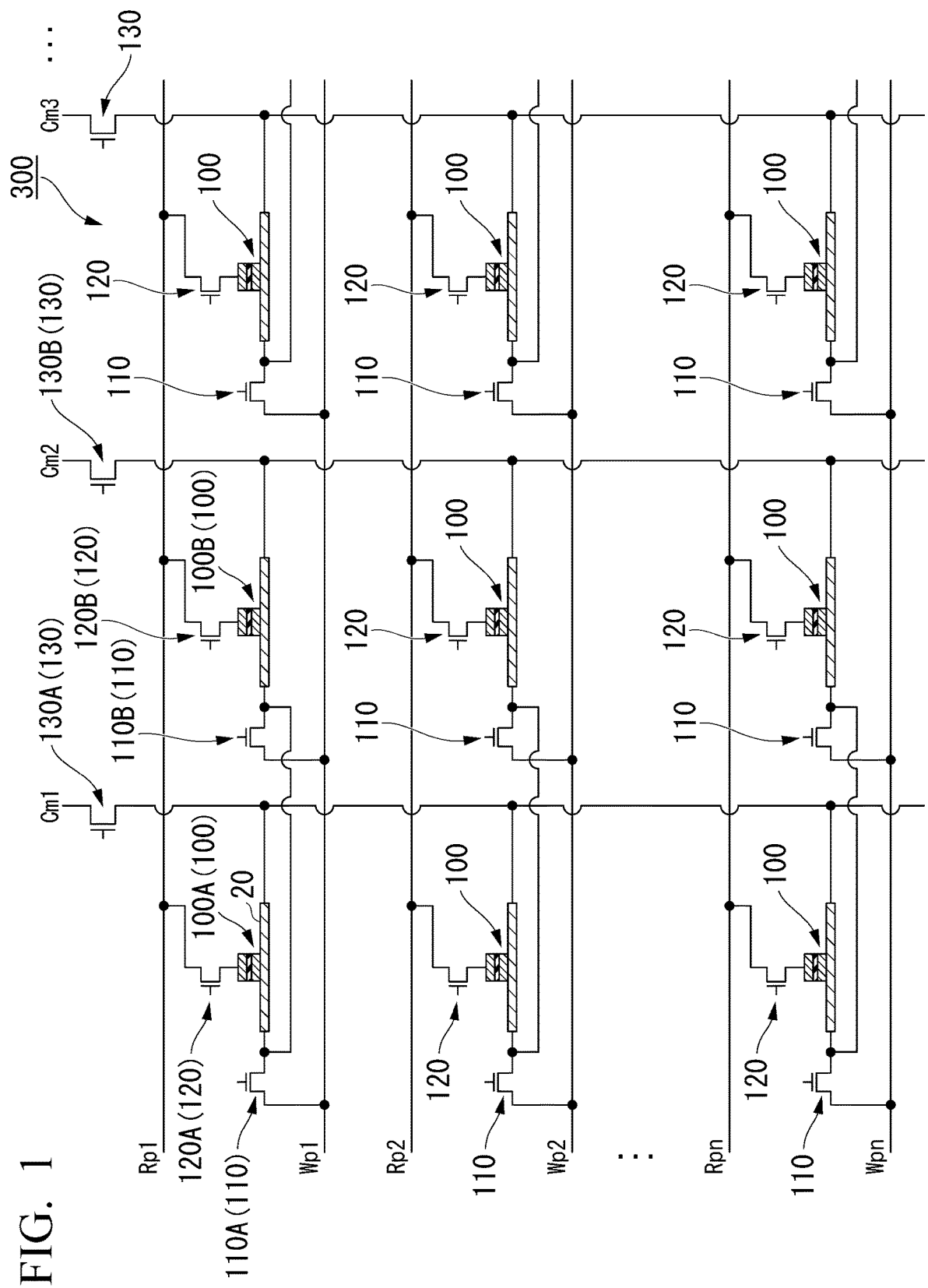
FIG. 1 is a schematic view of a magnetic memory according to a first embodiment.

Hereinafter, embodiments will be described in detail with reference to the drawings. In the drawings used in the following description, to make the features easy to understand, characteristic parts may be enlarged for convenience, and dimensional ratios of constituent elements may be different from actual ones. Materials, dimensions, and the like exemplified in the following description are examples, and the present disclosure is not limited thereto and can be appropriately modified and implemented within a range in which effects of the present disclosure are exhibited.

First, directions will be defined. An x direction and a y direction are directions substantially parallel to one surface of a substrate Sub (refer to FIG. 2) which will be described later. The x direction is one direction in which a first conductive layer 20 described later extends. The x direction is an example of a second direction. The y direction is one direction orthogonal to the x direction. The y direction is an example of a third direction. A z direction is a direction in which a first ferromagnetic layer 1 described later is located with respect to the first conductive layer 20 described later. The z direction is an example of a first direction. Hereinafter, a +z direction may be expressed as "upward" and a −z direction may be expressed as "downward". The upward and downward directions do not necessarily correspond to a direction in which gravity applies.

In the specification, "extending in the x direction" means that a dimension in the x direction is larger than a minimum dimension among dimensions in the x direction, the y direction, and the z direction, for example. The same applies when extending in other directions. In the specification, "connection" is not limited to a case of being physically connected and also includes a case of being electrically connected. In the specification, "facing" is not limited to a case in which two members are in contact with each other and also includes a case in which another member is present between the two members.

First Embodiment

FIG. 1 is a view schematically illustrating an example of constitution of a magnetic memory 300 according to a first embodiment. The magnetic memory 300 includes a plurality of storage elements 100, a plurality of write wirings Wp1 to Wpn, a plurality of common wirings Cm1 to Cmn, a plurality of read wirings Rp1 to Rpn, a plurality of first switching elements 110, a plurality of second switching elements 120, and a plurality of third switching elements 130. The magnetic memory 300 may be referred to as a magnetic recording array, and the storage element 100 may be referred to as a recording element, a magnetic element, or a spin element.

The write wirings Wp1 to Wpn electrically connect a power supply to one or more storage elements 100. The write wirings Wp1 to Wpn are wirings used when data is written in the storage element 100. The read wirings Rp1 to Rpn electrically connect the power supply to one or more storage elements 100. The read wirings Rp1 to Rpn are wirings used when data is read from the storage element 100. The common wirings Cm1 to Cmn electrically connect a reference electric potential to one or more storage elements 100. The reference electric potential is, for example, the ground. The common wirings Cm1 to Cmn may be provided in each of the plurality of storage elements 100 or may be provided over the plurality of storage elements 100. The power supply is connected to the magnetic memory 300 during use.

The first switching element 110 and the second switching element 120 shown in FIG. 1 are connected to each of the plurality of storage elements 100. The third switching element 130 is connected over the plurality of storage elements 100. The first switching element 110 is a switching element connected to a first conductive part 41 of each of the storage elements 100 which will be described later. The second switching element 120 is a switching element connected to the first ferromagnetic layer 1 of each of the storage elements 100 which will be described later. The third switching element 130 is a switching element connected to a second conductive part 42 of each of the storage elements 100 which will be described later. In FIG. 1, the first switching element 110 is connected between each of the storage elements 100 and each of the write wirings Wp1 to Wpn. The second switching element 120 is connected between each of the storage elements 100 and each of the read wirings Rp1 to Rpn. The third switching element 130 is connected to one end of each of common wirings Cm1 to Cmn connected to each of the storage elements 100.

The first switching element 110, the second switching element 120, and the third switching element 130 are elements which control a flow of a current. For example, the first switching element 110, the second switching element 120, and the third switching element 130 are an element which uses a phase change of a crystal layer, such as a transistor or an ovonic threshold switch (OTS), an element which uses a change in a band structure such as a metal-insulator transition (MIT) switch, an element which uses a breakdown voltage such as a Zener diode and an avalanche diode, and an element of which the conductivity changes according to a change in atomic positions.

Figure 2:
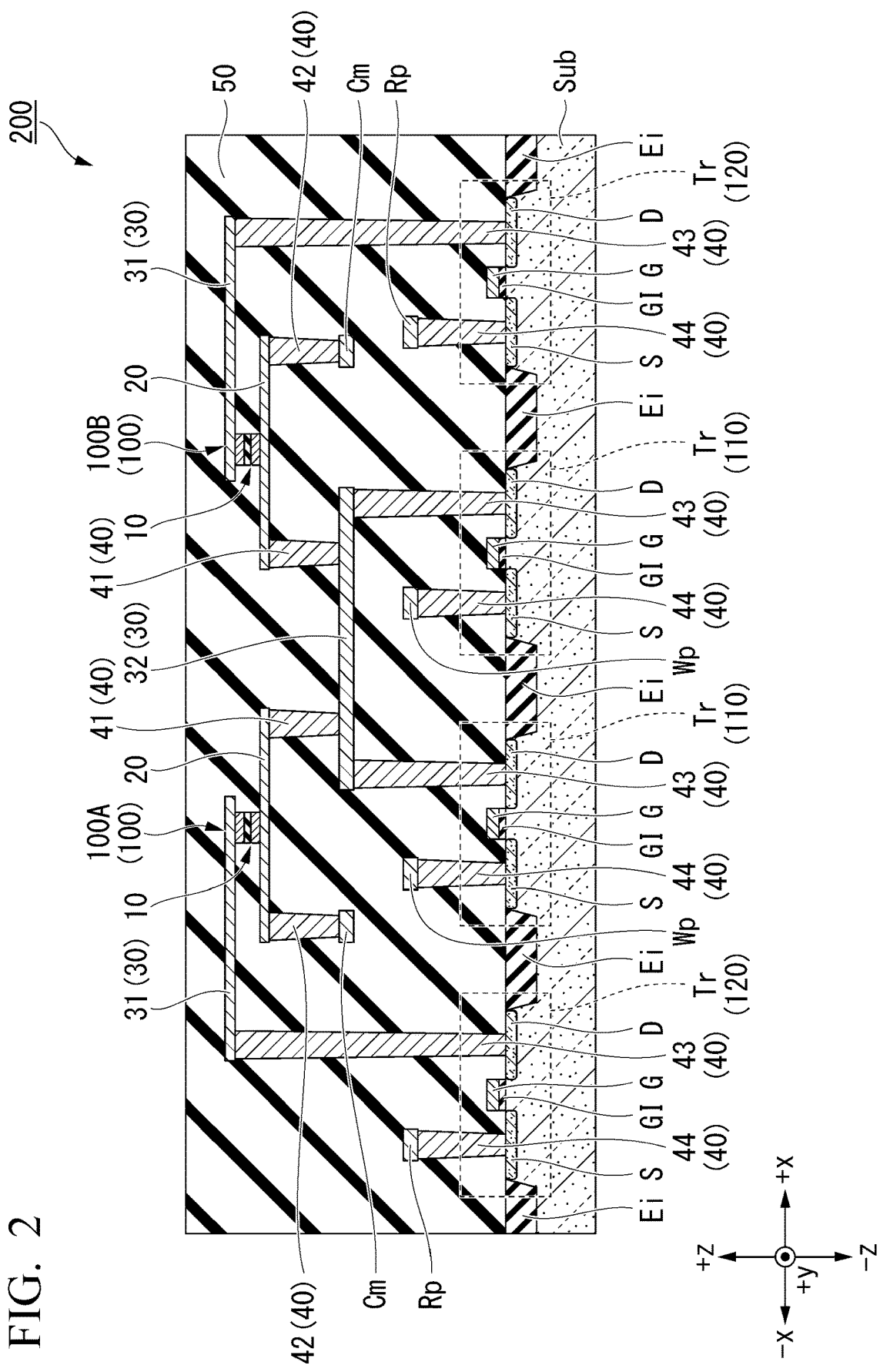
FIG. 2 is a cross-sectional view of a main part of the magnetic memory according to the first embodiment.

FIG. 2 is a cross-sectional view of a main part (a semiconductor device 200) of the magnetic memory 300 according to the first embodiment. FIG. 2 is a cross section of the storage element 100 taken along an xz plane (a plane along line A-A in FIG. 5) which passes through a center of a width of the first conductive layer 20, which will be described later, in the y direction.

The semiconductor device 200 includes a plurality of storage elements 100 and a plurality of switching elements (the first switching element 110, the second switching element 120, the third switching element 130) connected to the respective storage elements 100. In FIG. 2, two storage elements 100 are shown, and one is referred to as a first storage element 100A and the other is referred to as a second storage element 100B. The write wiring Wp, the read wiring Rp, and the common wiring Cm extend in a depth direction of the drawing (the y direction). The third switching element 130 is not present in the cross section shown in FIG. 2 and is located, for example, in the depth direction of the drawing (the −y direction).

The first switching element 110 and the second switching element 120 shown in FIG. 2 are transistors Tr. The transistor Tr has a gate electrode G, a gate insulating film GI, and a source region S and a drain region D formed on the substrate Sub. The substrate Sub is, for example, a semiconductor substrate. The adjacent transistors Tr are electrically separated from each other by an inter-element insulating part Ei. The inter-element insulating part Ei is formed of, for example, silicon oxide.

Figure 3:
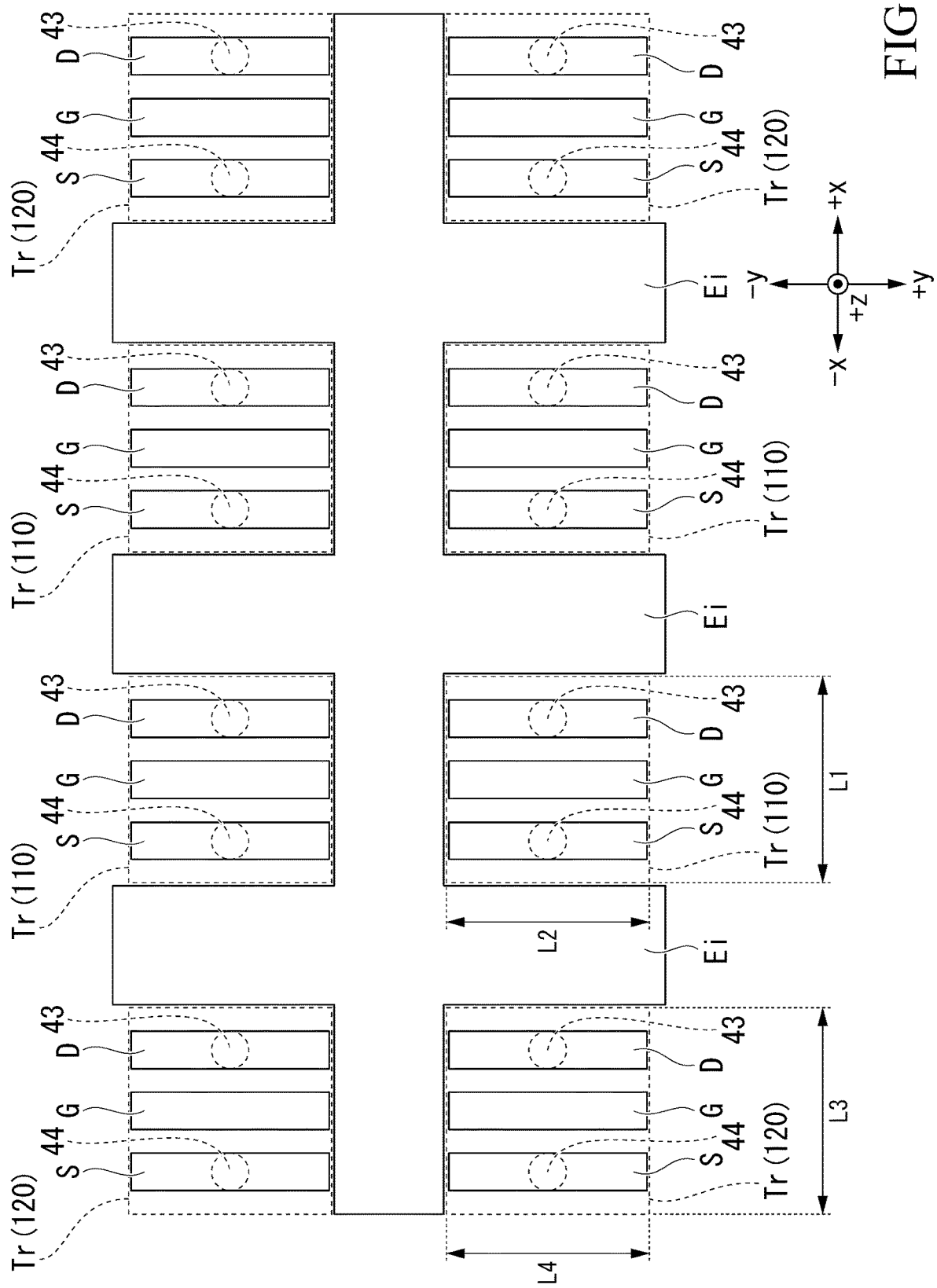
FIG. 3 is a plan view of a substrate of the magnetic memory according to the first embodiment.

FIG. 3 is a plan view of the substrate Sub of the magnetic memory 300 according to the first embodiment. The transistors Tr are arranged in the x direction and the y direction with the inter-element insulating parts Ei interposed therebetween. Lengths L1 and L3 of the transistors Tr in the x direction are determined by processing dimensions of the source region S, the gate electrode G, and the drain region D. For example, when a line width of each of the source region S, the gate electrode G, and the drain region D has a minimum processing dimension F, the lengths L1 and L3 of the transistors Tr in the x direction are 3F at a minimum. The length L1 of the first switching element 110 in the x direction and the length L3 of the second switching element 120 in the x direction are substantially the same. In the specification, "substantially the same" allows a shift of 10% or less when one of them is used as a reference.

Further, lengths L2 and L4 of the transistors Tr in the y direction are determined by a maximum rated current value of the transistor Tr. The maximum rated current value is a maximum value of a current which can normally flow through the transistor Tr. As an amount of current flowing through the transistor Tr increases, the lengths L2 and L4 of the transistor Tr in the y direction increase.

The maximum rated current value of each of the first switching elements 110 is greater than the maximum rated current value of each of the second switching elements 120, for example. When this condition is satisfied, a read current can be applied to the storage element 100 simply by opening one first switching element 110. Further, the maximum rated current value of each of the first switching elements 110 is preferably substantially the same as the maximum rated current value of the second switching element 120. When this condition is satisfied, the length L2 of the first switching element 110 in the y direction and the length L4 of the second switching element 120 in the y direction become substantially the same. When the lengths of the respective transistors Tr in the y direction are substantially the same, the respective transistors Tr can be regularly disposed, and integration characteristics of the magnetic memory 300 are improved.

As shown in FIG. 2, the first switching element 110, the second switching element 120, and the storage element 100 are electrically connected to each other through a conductive layer 30 and a plurality of conductive parts 40. The conductive layer 30 and the conductive parts 40 include a material having conductivity. The conductive part 40 extends in the z direction. The conductive layer 30 extends in an xy plane.

Hereinafter, two conductive parts 40 connected to the first conductive layer 20 are referred to as a first conductive part 41 and a second conductive part 42, the conductive part 40 connected to the drain region D of the transistor Tr is referred to as a third conductive part 43, and the conductive part 40 connected to the source region S of the transistor Tr is referred to as a fourth conductive part 44. Also, the conductive layer 30 connected to a magnetoresistance effect element 10 on the side thereof opposite to the first conductive layer 20 is referred to as a conductive layer 31, and the conductive layer 30 connected to the first conductive part 41 and the third conductive part 43 is referred to as a conductive layer 32.

The first conductive part 41 connects the first conductive layer 20 to the conductive layer 32, for example. The second conductive part 42 connects the first conductive layer 20 to the common wiring Cm, for example. The third conductive part 43 connects the drain region D of the transistor Tr to the conductive layer 31 or the conductive layer 32, for example. The fourth conductive part 44 connects the source region S of the transistor Tr to the write wiring Wp or the read wiring Rp, for example. The conductive layer 31 connects the magnetoresistance effect element 10 to the third conductive part 43, for example. The conductive layer 32 connects two first conductive parts 41 and connects two third conductive parts 43.

The first conductive parts 41 of the first storage element 100A and the second storage element 100B are electrically connected to two first switching elements 110. The number of first switching elements 110 connected to the respective first conductive parts 41 is not limited to two and may be three or more.

The first storage element 100A and the second storage element 100B are connected to the same first switching element 110. The first conductive parts 41 of the first storage element 100A and the second storage element 100B are respectively connected to the same two first switching elements 110 via the conductive layer 32 and the third conductive part 43. The first storage element 100A and the second storage element 100B share the two first switching elements 110.

The storage element 100 and the transistor Tr are electrically separated by an insulating layer 50 except for at the conductive layer 30 or the conductive part 40. The insulating layer 50 is an insulating layer which insulates between wirings of a multilayer wiring and between elements. The insulating layer 50 is, for example, silicon oxide ($SiO_x$), silicon nitride ($SiN_x$), silicon carbide (SiC), chromium nitride, silicon carbonitride (SiCN), silicon oxynitride (SiON), aluminum oxide ($Al_2O_3$), zirconium oxide ($ZrO_x$), or the like.

Figure 4:
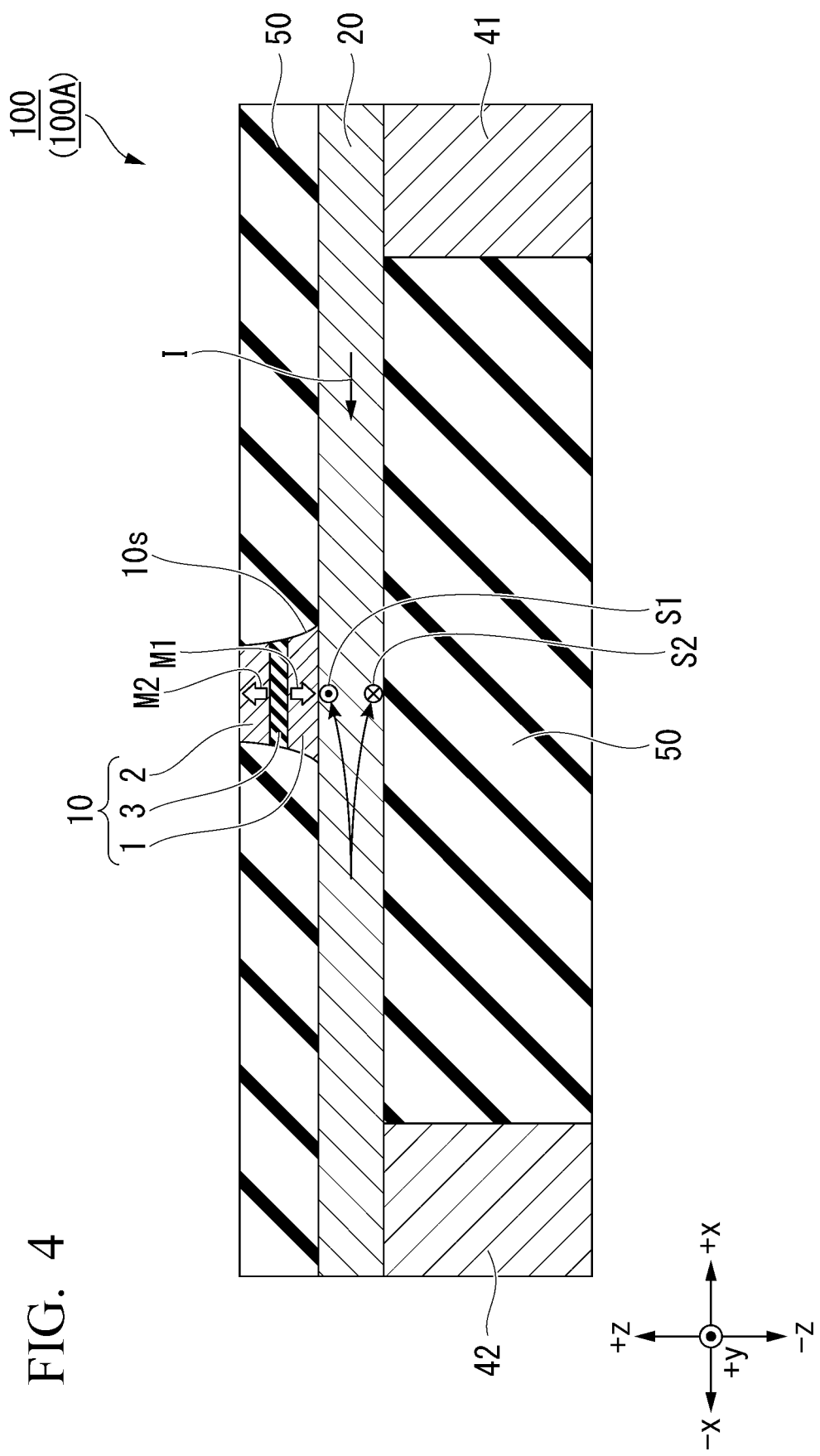
FIG. 4 is a cross-sectional view of the vicinity of a storage element of the magnetic memory according to the first embodiment.
Figure 5:
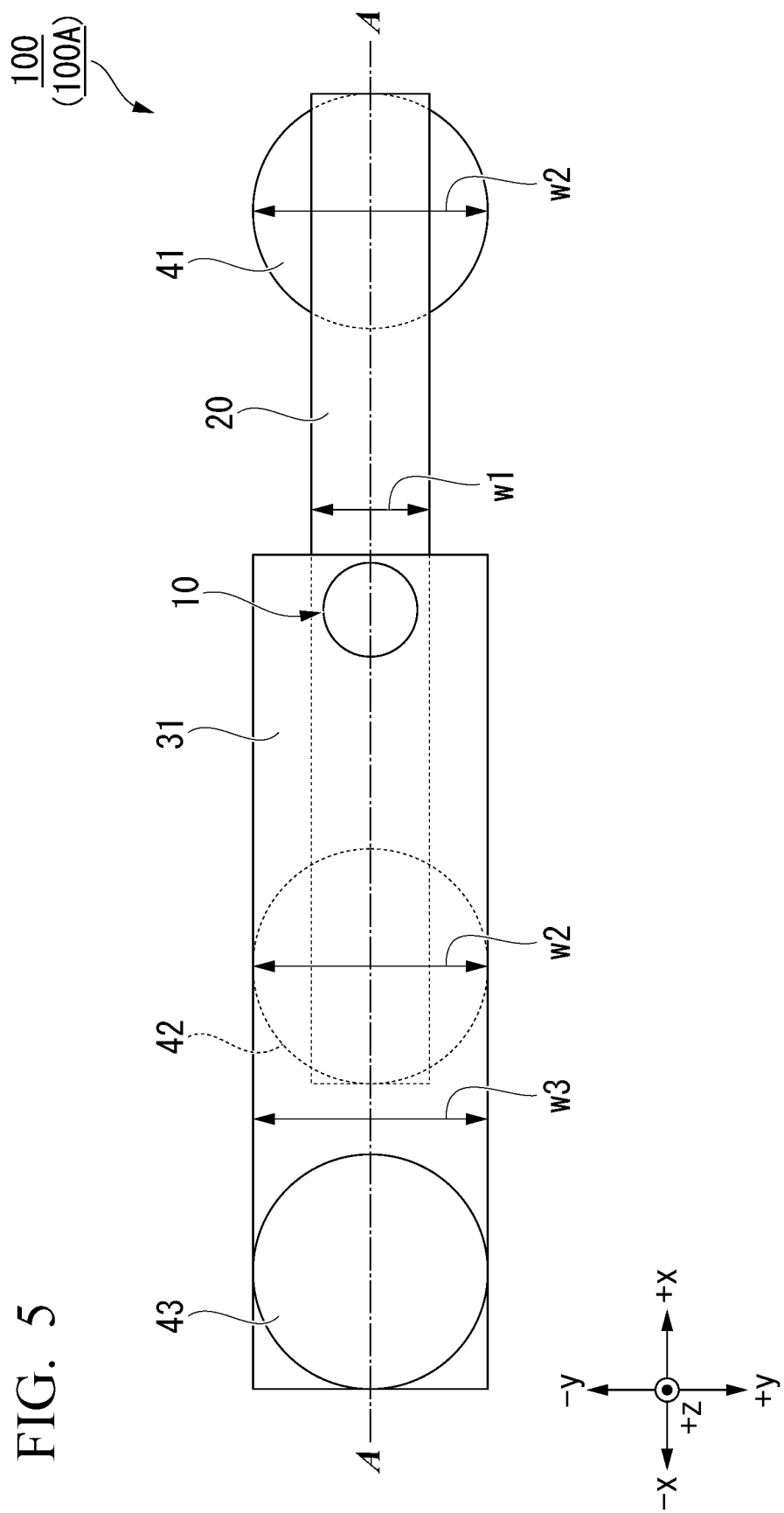
FIG. 5 is a plan view of the storage element of the magnetic memory according to the first embodiment.

FIG. 4 is a cross-sectional view of the vicinity of the storage element 100 (the first storage element 100A) of the magnetic memory 300 according to the first embodiment. FIG. 5 is a plan view of the storage element 100 of the magnetic memory 300 according to the first embodiment. FIG. 4 is a cross section taken by a plane along line A-A in FIG. 5.

The storage element 100 includes the magnetoresistance effect element 10, the first conductive layer 20, the first conductive part 41, and the second conductive part 42. The storage element 100 is an element which performs magnetization rotation using a spin orbit torque (SOT), and may be referred to as a spin orbit torque type magnetization rotational element, a spin orbit torque type magnetization reversing element, or a spin orbit torque type magnetoresistance effect element.

The magnetoresistance effect element 10 faces the first conductive layer 20. The magnetoresistance effect element 10 is, for example, a columnar body having a circular shape in a plan view in the z direction. The shape of the magnetoresistance effect element 10 in the plan view in the z direction is not limited to a circle and may be, for example, an ellipse or a rectangle. An outer peripheral length or diameter of the magnetoresistance effect element 10 increases, for example, as it approaches the first conductive layer 20. A side surface 10s of the magnetoresistance effect element 10 is inclined in the x direction or the y direction with respect to the z direction, for example.

The magnetoresistance effect element 10 has the first ferromagnetic layer 1, a second ferromagnetic layer 2, and a nonmagnetic layer 3. The first ferromagnetic layer 1 faces the first conductive layer 20. The second ferromagnetic layer 2 faces the conductive layer 31. The nonmagnetic layer 3 is sandwiched between the first ferromagnetic layer 1 and the second ferromagnetic layer 2.

The first ferromagnetic layer 1 and the second ferromagnetic layer 2 have magnetizations M1 and M2, respectively. An orientation direction of the magnetization M2 of the second ferromagnetic layer 2 is less likely to change than that of the magnetization M1 of the first ferromagnetic layer 1 when a predetermined external force is applied. The first ferromagnetic layer 1 may be referred to as a magnetization free layer, and the second ferromagnetic layer 2 may be referred to as a magnetization fixed layer or a magnetization reference layer. In the magnetoresistance effect element 10, a resistance value changes according to a difference in a relative angle between the magnetization M1 of the first ferromagnetic layer 1 and the magnetization M2 of the second ferromagnetic layer 2 which sandwich the nonmagnetic layer 3.

The first ferromagnetic layer 1 and the second ferromagnetic layer 2 include a ferromagnetic material. The ferromagnetic material includes, for example, a metal selected from the group consisting of Cr, Mn, Co, Fe and Ni, an alloy containing one or more of these metals, an alloy containing these metals and at least one or more of B, C, and N, or the like. The ferromagnetic material is, for example, Co—Fe, Co—Fe—B, Ni—Fe, a Co—Ho alloy, a Sm—Fe alloy, a Fe—Pt alloy, a Co—Pt alloy, or a CoCrPt alloy.

The first ferromagnetic layer 1 and the second ferromagnetic layer 2 may include a Heusler alloy. The Heusler alloy includes an intennetallic compound having a chemical composition of XYZ or $X_2YZ$. X is a Co—, Fe—, Ni— or Cu-group transition metal element or noble metal element on the periodic table, Y is a Mn—, V—, Cr— or Ti— group transition metal or an element of X, and Z is a typical Group III to V element. The Heusler alloy is, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, or the like. The Heusler alloy has a high spin polarization.

The magnetoresistance effect element 10 may have an antiferromagnetic layer on a surface of the second ferromagnetic layer 2 on the side thereof opposite to the nonmagnetic layer 3 via a spacer layer. The second ferromagnetic layer 2, the spacer layer, and the antiferromagnetic layer have a synthetic antiferromagnetic structure (SAF structure). The synthetic antiferromagnetic structure is constituted of two magnetic layers which sandwich a nonmagnetic layer. A coercivity of the second ferromagnetic layer 2 increases due to antiferromagnetic coupling between the second ferromagnetic layer 2 and the antiferromagnetic layer, as compared with a case in which the antiferromagnetic layer is not provided. The antiferromagnetic layer is, for example, IrMn, PtMn, or the like. The spacer layer includes, for example, at least one selected from the group consisting of Ru, Ir, and Rh.

The nonmagnetic layer 3 is formed of, for example, a nonmagnetic insulator, a semiconductor, or a metal. The nonmagnetic insulator is, for example, $Al_2O_3$, $SiO_2$, MgO, $MgAl_2O_4$, or a material in which Al, Si, or Mg is partially replaced with Zn, Be, or the like. These materials have a large band gap and excellent insulating properties. When the nonmagnetic layer 3 is formed of a nonmagnetic insulator, the nonmagnetic layer 3 is a tunnel barrier layer. A nonmagnetic metal is, for example, Cu, Au, Ag or the like. A nonmagnetic semiconductor is, for example, Si, Ge, CuInSe$_2$, CuGaSe$_2$, Cu(In, Ga)Se$_2$, or the like.

The magnetoresistance effect element 10 may have layers other than the first ferromagnetic layer 1, the second ferromagnetic layer 2, and the nonmagnetic layer 3. For example, an underlayer may be provided between the first conductive layer 20 and the magnetoresistance effect element 10. Further, for example, a cap layer may be provided between the conductive layer 31 and the magnetoresistance effect element 10. The underlayer and the cap layer enhance crystallinity of each of the layers constituting the magnetoresistance effect element 10.

The first conductive layer 20 extends in the x direction. A length of the first conductive layer 20 in the x direction when seen in the z direction is longer than that in the y direction, for example. The first conductive layer 20 faces the first ferromagnetic layer 1 of the magnetoresistance effect element 10. At least a part of the first conductive layer 20 sandwiches the first ferromagnetic layer 1 together with the nonmagnetic layer 3 in the z direction. A width w1 of the first conductive layer 20 in the y direction is shorter than a width w2 of the first conductive part 41 and the second conductive part 42 in the y direction and a width w3 of the conductive layer 31 (refer to FIG. 5). In the first conductive layer 20, a current density of the write current can be efficiently increased.

The first conductive layer 20 is any one of a metal, an alloy, an intermetallic compound, a metal boride, a metal carbide, a metal silicide, and a metal phosphide having a function of generating a spin current by a spin Hall effect when a current I flows. The first conductive layer 20 may be referred to as spin orbit torque wiring.

The spin Hall effect is a phenomenon in which a spin current is induced in a direction orthogonal to a current flow direction based on a spin orbit interaction when a current is applied. The spin Hall effect is the same as a normal Hall effect in that a movement (traveling) direction of moving (traveling) charges (electrons) is bent. In the normal Hall effect, the movement direction of charged particles moving in a magnetic field is bent by a Lorentz force. On the other hand, in the spin Hall effect, even though there is no magnetic field, a movement direction of spin is bent only due to the movement of electrons (only due to a flowing current).

The first conductive layer 20 generates a spin current by the spin Hall effect when the current I flows. When the current I flows through the first conductive layer 20, a first spin S1 oriented in one direction and a second spin S2 oriented in a direction opposite to the first spin S1 are bent by the spin Hall effect in a direction orthogonal to a flow direction of the current I. For example, the first spin S1 oriented in the +y direction is bent in the +z direction, and the second spin S2 oriented in the -y direction is bent in the -z direction.

In a nonmagnetic material (a material which is not a ferromagnetic material), the number of electrons in the first spin S1 and the number of electrons in the second spin S2 generated by the spin Hall effect are equal. That is, the number of electrons of the first spin S1 in the +z direction is equal to the number of electrons of the second spin S2 in the -z direction. The first spin S1 and the second spin S2 are induced in a direction in which uneven distribution of the spins is eliminated. In the movement of the first spin S1 and the second spin S2 in the z direction, since the flows of charges are offset from each other, an amount of current becomes zero. The spin current without an electric current is particularly referred to as a pure spin current.

When a flow of electrons in the first spin S1 is J$_\uparrow$, a flow of electrons in the second spin S2 is J$_\downarrow$, and the spin current is J$_S$, J$_S$=J$\uparrow$−J$\downarrow$. The spin current J$_S$ is generated in the z direction. The first spin S1 is injected into the first ferromagnetic layer 1 which faces the first conductive layer 20. For example, the first conductive layer 20 induce an SOT which can reverse the magnetization of the first ferromagnetic layer 1 to the magnetization of the first ferromagnetic layer 1.

A main component of the first conductive layer 20 is preferably a nonmagnetic heavy metal. A heavy metal is a metal having a specific gravity equal to or greater than that of yttrium (Y). The nonmagnetic heavy metal is preferably a nonmagnetic metal having an atomic number equal to or larger than an atomic number of 39 and having d or f electrons in the outermost shell. The first conductive layer 20 is, for example, Hf, Ta, or W. Nonmagnetic heavy metals have a spin orbit interaction stronger than that of other metals. The spin Hall effect is caused by the spin orbit interaction, the spins are likely to be unevenly distributed in the first conductive layer 20, and the spin current J$_S$ is easily generated.

The first conductive layer 20 may include a magnetic metal. The magnetic metal is a ferromagnetic metal or an antiferromagnetic metal. A small amount of magnetic metal contained in the nonmagnetic material becomes a cause of scattering of spins. The small amount is, for example, 3% or less of a total of molar ratios of the elements constituting the first conductive layer 20. When the spins are scattered by the magnetic metal, the spin orbit interaction is enhanced, and an efficiency of generation of the spin current with respect to the electric current is increased.

The first conductive layer 20 may include a topological insulator. A topological insulator is a material in which the interior of the material is an insulator or a high resistance body, and a spin-polarized metal state is generated on a surface thereof. An internal magnetic field is generated in the topological insulator by the spin orbit interaction. In the topological insulator, a new topological phase develops due to the effect of the spin orbit interaction even in the case where there is no external magnetic field. The topological insulator can generate a pure spin current with high efficiency due to a strong spin orbit interaction and breaking of inversion symmetry at an edge.

The topological insulator is, for example, SnTe, Bi$_{1.5}$Sb$_{0.5}$Te$_{1.7}$Se$_{1.3}$, TlBiSe$_2$, Bi$_2$Te$_3$, Bi$_{1-X}$Sb$_X$, (Bi$_{1-X}$Sb$_X$)$_2$Te$_3$. The topological insulator can generate a spin current with high efficiency.

For example, at least a part of the first conductive part 41 and the second conductive part 42 sandwich the first ferromagnetic layer 1 in the x direction when seen in the z direction.

Also, the storage element 100 may have a magnetic field applying unit which applies an external magnetic field to the magnetoresistance effect element 10. The magnetic field applying unit is, for example, two magnetic materials which sandwich the magnetoresistance effect element 10 in the x direction or the y direction. Further, the magnetic field applying unit may be an electromagnet type or a strip-line type which can variably control an applied magnetic field strength. Furthermore, instead of the magnetic field applying unit, an electric field applying unit which applies an electric field may be used.

Next, a method for manufacturing the magnetic memory 300 will be described. First, the substrate Sub is prepared.

Impurities are doped at a predetermined position on the substrate Sub to form the source region S and the drain region D. Then, the gate insulating film GI and the gate electrode G are formed between the source region S and the drain region D. The source region S, the drain region D, the gate insulating film GI, and the gate electrode G become the transistor Tr. A commercially available product in which the transistor Tr is formed may be used as the substrate Sub.

Next, the insulating layer 50 is formed to cover the transistor Tr. The conductive part 40 which extends in the z direction is formed by forming an opening in the insulating layer 50 and filling the opening with a conductor. The opening is formed by, for example, photolithography, an ion beam, or the like. The conductive part 40 is formed by, for example, sputtering or the like.

In addition, the first conductive layer 20, the conductive layer 30, the write wiring Wp, the read wiring Rp, the common wiring Cm, and the like which extend in the xy plane are obtained by forming the insulating layer 50 to a predetermined thickness and then forming a conductive layer on one surface of the insulating layer 50. A conductive film is processed into a predetermined shape to form the first conductive layer 20, the conductive layer 30, the write wiring Wp, the read wiring Rp, the common wiring Cm, and the like. The magnetoresistance effect element 10 is obtained by sequentially laminating a ferromagnetic layer, a nonmagnetic layer, and a ferromagnetic layer and processing them into a predetermined shape. For forming each of the layers, a sputtering method, a chemical vapor deposition (CVD) method, an electron beam evaporation method (EB evaporation method), an atomic laser deposition method, or the like can be used. The processing of each of the layers can be performed using photolithography or the like.

Next, an operation of the magnetic memory 300 will be described. First, a write operation will be described. A case in which data is written in the first storage element 100A shown in FIG. 1 will be described as an example. In order to apply a write current to the first storage element 100A, the first switching elements 110A and 110B and the third switching element 130A connected to the first conductive layer 20 of the first storage element 100A are turned on. When these switching elements are turned on, a write current flows between the write wiring Wp1 and the common wiring Cm1. The write current flows, for example, in the order of the write wiring Wp1, the first switching elements 110A and 110B, the first conductive layer 20, and the third switching element 130A.

When the write current flows in the first conductive layer 20, the first spin S1 is injected into the first ferromagnetic layer 1 by the spin Hall effect, as shown in FIG. 4. The first spin S1 induces the spin orbit torque (SOT) to the magnetization M1 of the first ferromagnetic layer 1. The magnetization M1 of the first ferromagnetic layer 1 is subjected to the spin orbit torque (SOT), and a magnetization state thereof changes. The first storage element 100A stores information by a difference in a relative angle between the magnetization M1 of the first ferromagnetic layer 1 and the magnetization M2 of the second ferromagnetic layer 2. Data is written in the first storage element 100A by changing the magnetization state of the first ferromagnetic layer 1.

In the write operation, the write current may be applied to the first conductive layer 20 stepwise. That is, current pulses with different current amounts may be applied to the first conductive layer 20 stepwise. For example, when timings at which the two first switching elements 110A and 110B are turned on are delayed, the current pulses with different current amounts are applied to the first conductive layer 20 stepwise.

Figure 6:
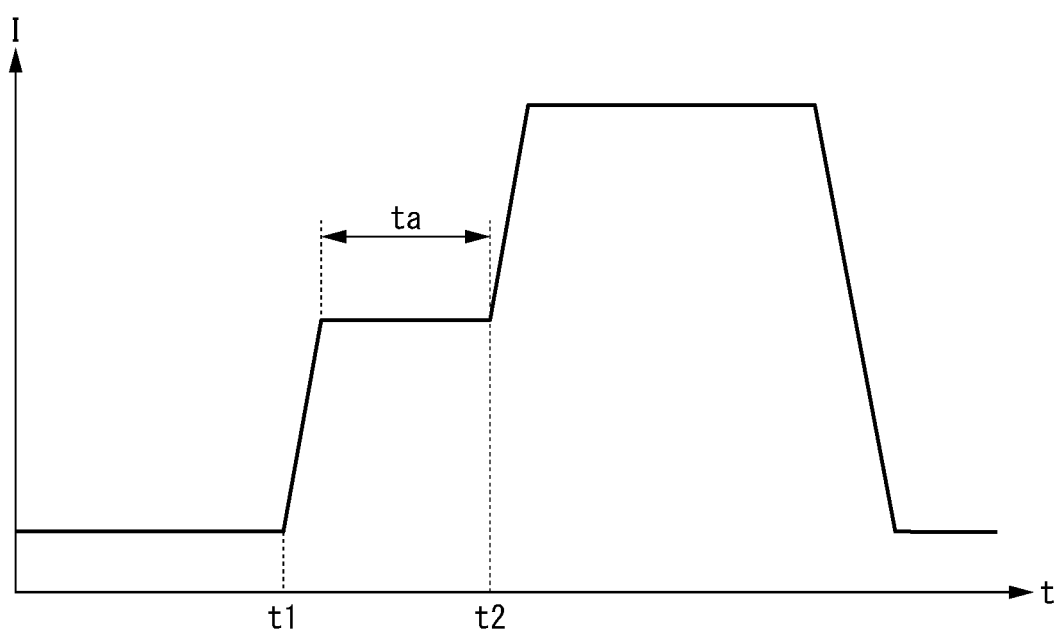
FIG. 6 is a graph showing change over time of a current pulse applied to a first conductive layer.

FIG. 6 is a graph showing an example of a change over time of the current pulse applied to the first conductive layer 20. A vertical axis represents an amount of current applied to the first conductive layer 20, and a horizontal axis represents time. First, when the first switching element 110A is turned on at time t1, a write current which is the maximum rated current value of the first switching element 110A at maximum flows through the first conductive layer 20. Then, when the first switching element 110B is turned on at time t2, a write current having a value obtained by adding the maximum rated current values of the two first switching elements 110A and 110B at maximum flows in the first conductive layer 20.

The magnetization M1 of the first ferromagnetic layer 1 is reversed at the time when an inversion current density is exceeded. In a state in which only the first switching element 110A is turned on, a sufficient inversion current density cannot be secured, and the magnetization M1 of the first ferromagnetic layer 1 is not reversed. When the two first switching elements 110A and 110B are turned on, a write current having a sufficient inversion current density flows through the first conductive layer 20, and the magnetization M1 of the first ferromagnetic layer 1 is reversed. On the other hand, the write current flows in the first conductive layer 20 even when only the first switching element 110A is turned on. When a write current flows through the first conductive layer 20, the first conductive layer 20 generates heat. The heat generated in the first conductive layer 20 makes the magnetization M1 of the first ferromagnetic layer 1 unstable. When the magnetization M1 of the first ferromagnetic layer 1 becomes unstable, the magnetization M1 is easily reversed. That is, when the current pulses with different current amounts are applied to the first conductive layer 20 stepwise, the magnetization M1 of the first ferromagnetic layer 1 becomes unstable due to the heat generated by a first-stage current pulse, and this heat assists the reversal of the magnetization M1 of the first ferromagnetic layer 1 by a second-stage current pulse. An application time ta of the first-stage current pulse is, for example, 5 nsec or more. When the application time ta of the first-stage current pulse is 5 nsec, the first ferromagnetic layer 1 can be sufficiently heated.

Next, a read operation of the magnetic memory 300 will be described. A case in which data is read from the first storage element 100A shown in FIG. 1 will be described as an example. When data is read from the first storage element 100A, a read current is applied in a laminating direction (the z direction) of the magnetoresistance effect element 10. The second switching element 120 and any one of the first switching elements 110A, 110B or the third switching element 130A connected to the first conductive layer 20 of the first storage element 100A are turned on to apply the read current to the first storage element 100A. The read current is smaller than the write current. Therefore, data can be read from the first storage element 100A even when only one of the first switching elements 110A and 110B is turned on.

When the read current flows in the z direction of the magnetoresistance effect element 10, a resistance value of the first storage element 100A is obtained based on Ohm's law. The resistance value of the first storage element 100A differs according to the difference in the relative angle between the magnetization M1 of the first ferromagnetic layer 1 and the magnetization M2 of the second ferromagnetic layer 2. That is, the resistance value of the first storage element 100A can be read as data, and the data can be read from the first storage element 100A.

The magnetic memory 300 according to the first embodiment can improve the integration characteristics. The reason will be described below.

Figure 7:
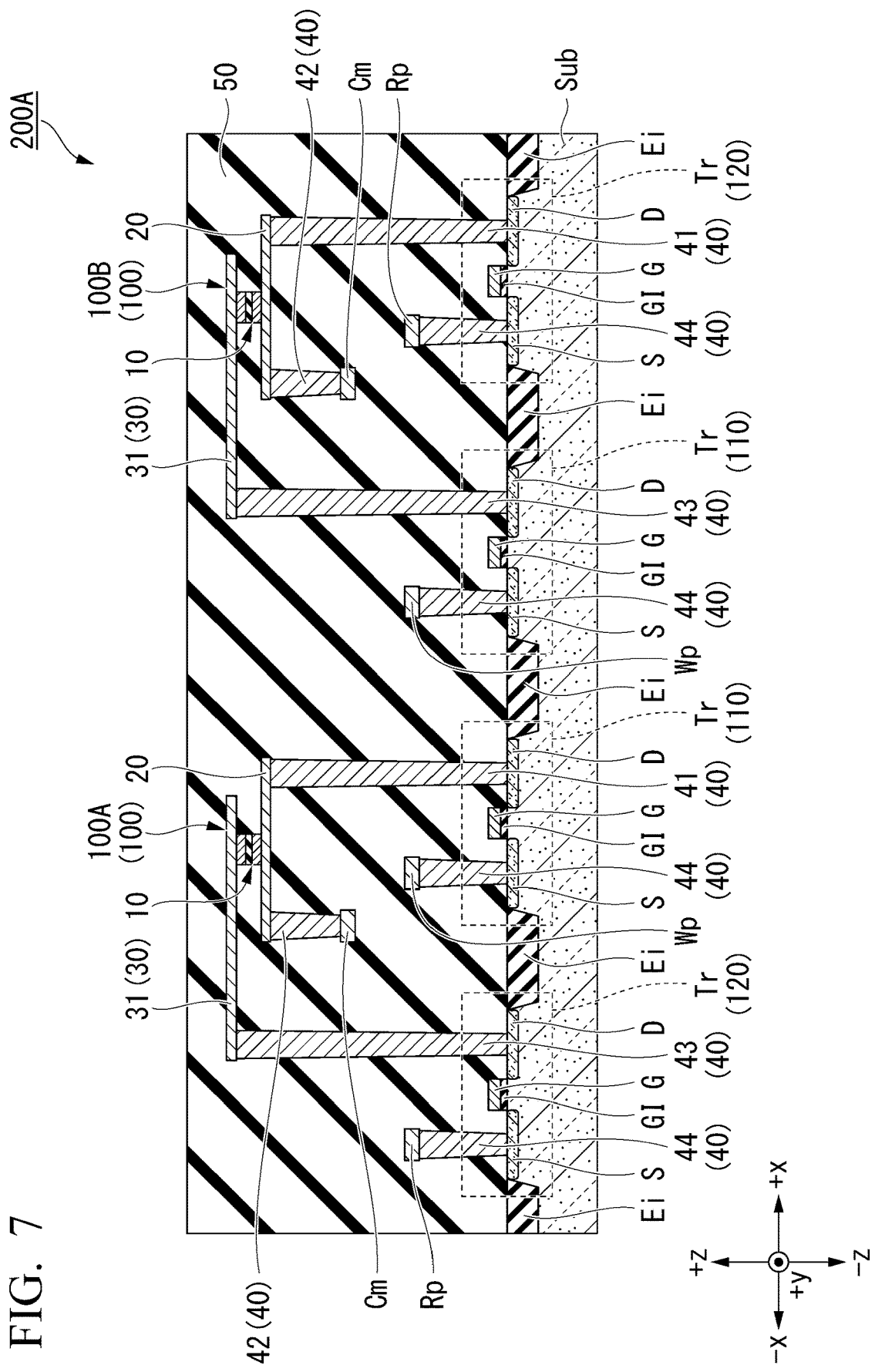
FIG. 7 is a cross-sectional view of a main part of a magnetic memory according to Comparative Example 1.
Figure 8:
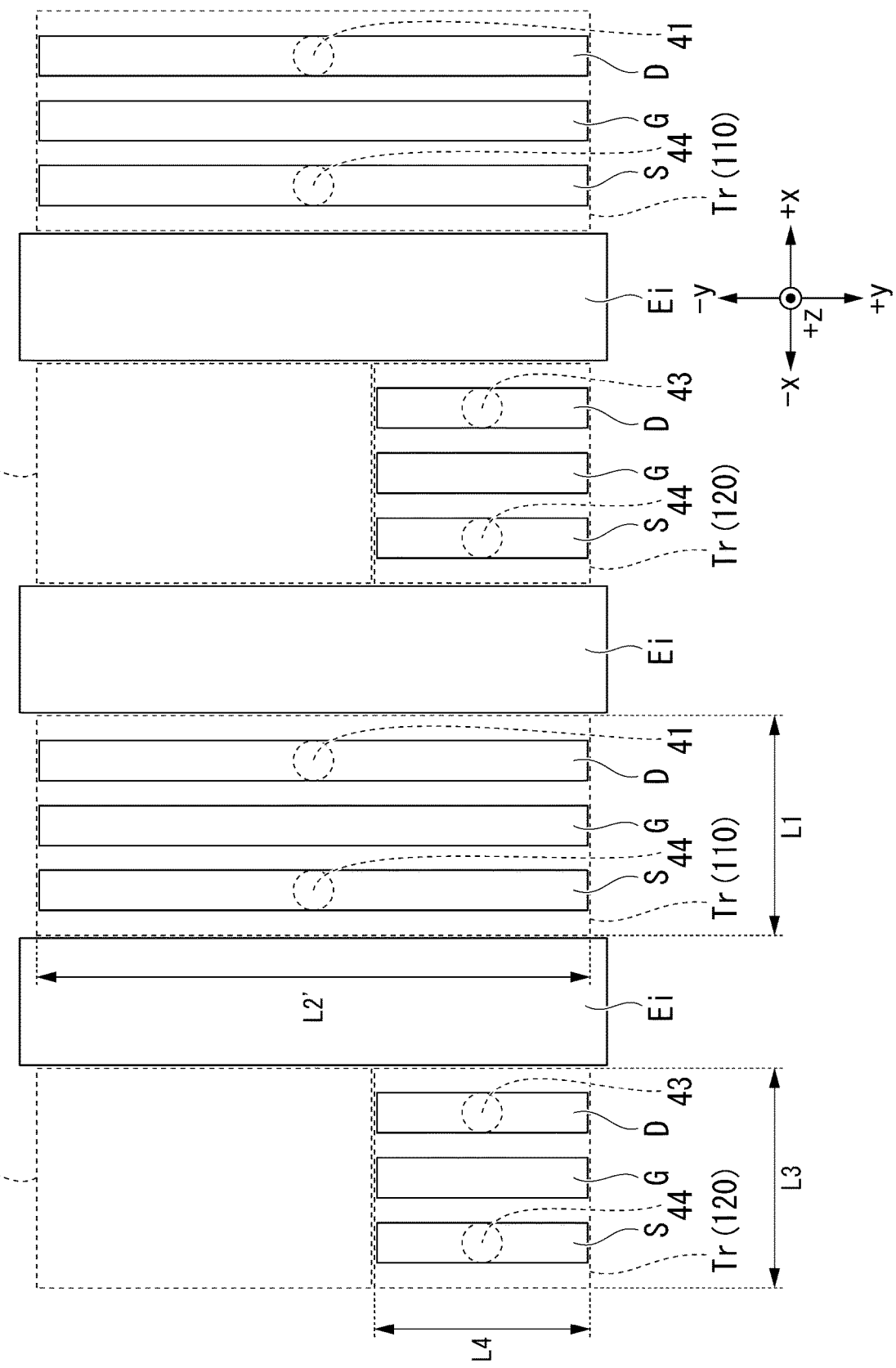
FIG. 8 is a plan view of a substrate of the magnetic memory according to Comparative Example 1.

FIG. 7 is a cross-sectional view of a main part (a semiconductor device 200A) of a magnetic memory according to Comparative Example 1. FIG. 8 is a plan view of a substrate of the magnetic memory according to Comparative Example 1. The semiconductor device 200A according to Comparative Example 1 is different from the magnetic memory 300 according to the first embodiment in that one first switching element 110 connected to the first conductive part 41 is provided. Other constitutions are the same, and the same reference numerals are given to the same constitutions.

In the magnetic memory according to Comparative Example 1, one first switching element 110 controls the flow of the write current. The maximum rated current value of the first switching element 110 is equal to or greater than a current value of the write current. The maximum rated current value of the first switching element 110 is determined by a length L2' of the first switching element 110 in the y direction. Since the write current is larger than the read current, the maximum rated current value of the first switching element 110 is larger than the maximum rated current value of the second switching element 120. The length L2' of the first switching element 110 is longer than the length L4 of the second switching element 120.

As shown in FIG. 8, when the first switching element 110 and the second switching element 120 are arranged in the x and y directions, an unusable dead space Sp is generated by a difference in a length between the first switching element 110 and the second switching element 120 in the y direction. In other words, the magnetic memory according to Comparative Example 1 wastes an area corresponding to the dead space Sp, and has poor integration characteristics.

In order to improve the integration characteristics, it is also conceivable to arrange the first switching element 110 and the second switching element 120 to fill the dead space Sp. However, the first switching element 110 and the second switching element 120 need to be manufactured and arranged separately, and the general-purpose substrate Sub cannot be used. Further, it is also conceivable to extend the length L4 of the second switching element 120 in the y direction to the same length as the length L2' of the first switching element 110 and to arrange the first switching element 110 and the second switching element 120. However, the length LA of the second switching element 120 in the y direction unnecessarily extends (the maximum rated current value of the second switching element 120 is unnecessarily increased), and the integration characteristics cannot be improved.

On the other hand, in the magnetic memory 300 according to the first embodiment, as shown in FIG. 3, the first switching elements 110 and the second switching elements 120 can be regularly arranged without waste. Therefore, the magnetic memory 300 according to the first embodiment can improve the integration characteristics.

Second Embodiment

Figure 9:
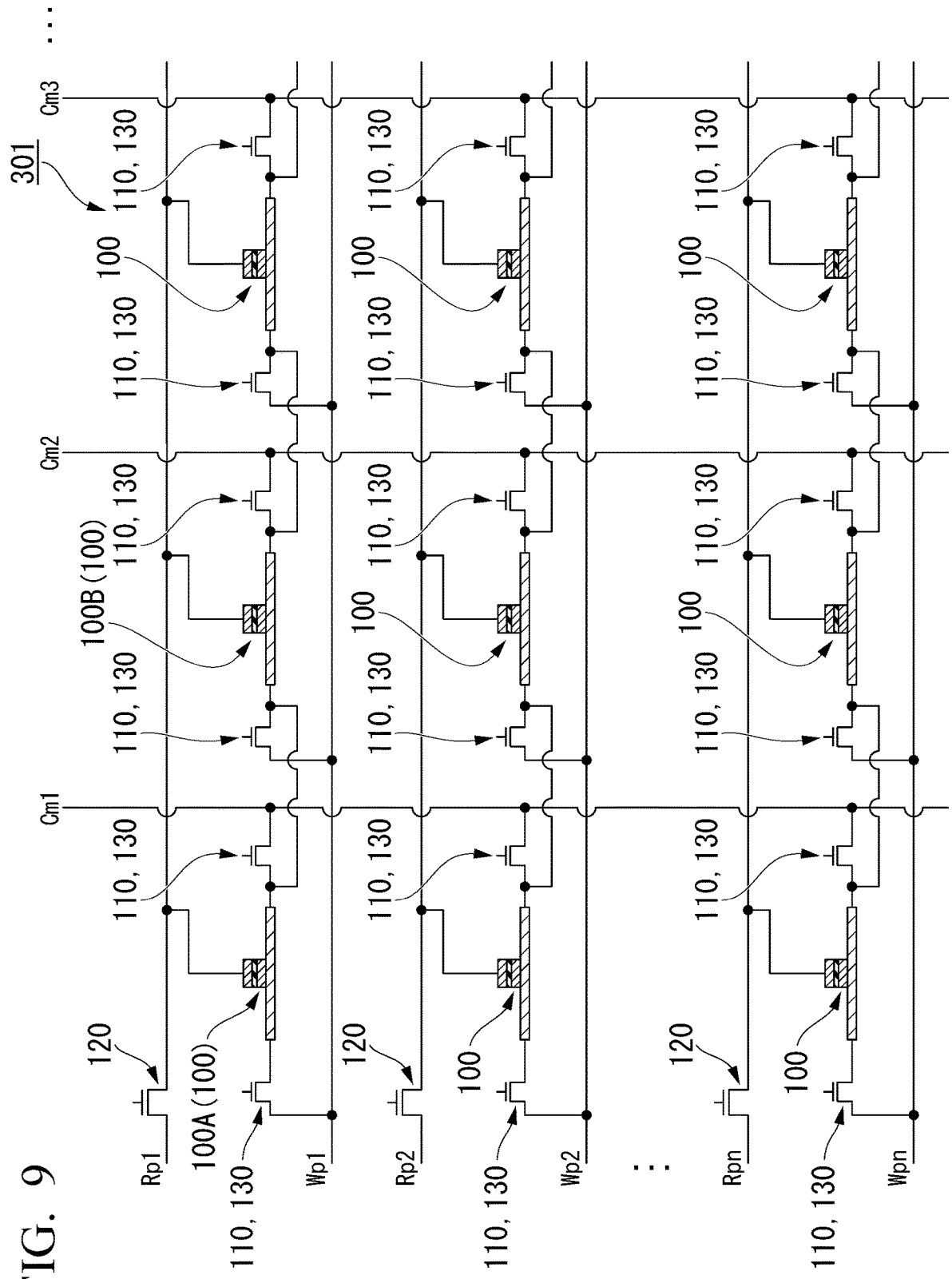
FIG. 9 is a schematic view of a magnetic memory according to a second embodiment.
Figure 10:
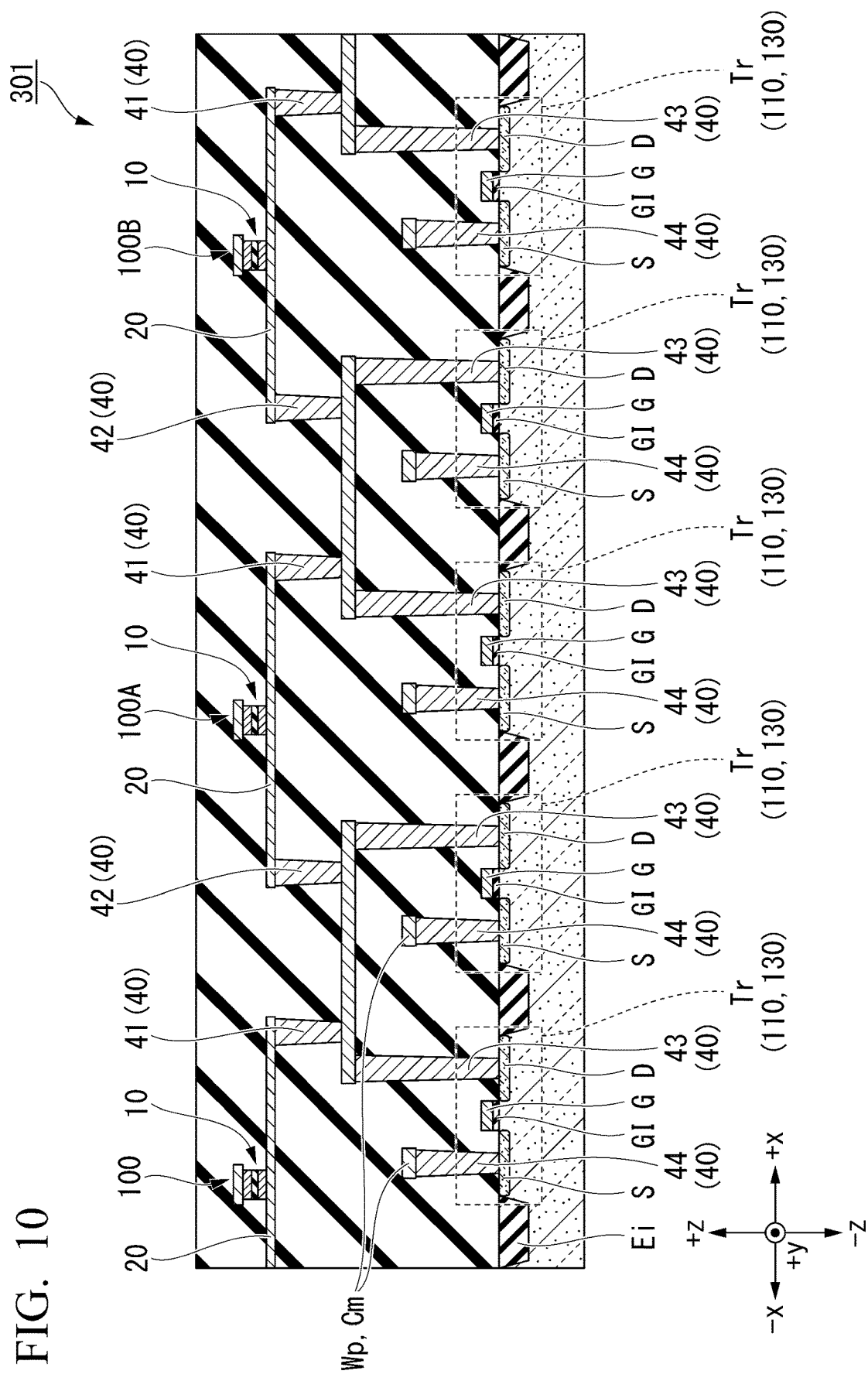
FIG. 10 is a cross-sectional view of a main part of the magnetic memory according to the second embodiment.

FIG. 9 is a view schematically illustrating an example of constitution of a magnetic memory 301 according to a second embodiment. FIG. 10 is a cross-sectional view of a main part (a semiconductor device 201) of the magnetic memory 301 according to the second embodiment. FIG. 10 is a cross section of the storage element 100 taken along the xz plane which passes through a center of the width of the first conductive layer 20 in the y direction. The magnetic memory 301 according to the second embodiment is different from the magnetic memory 300 according to the first embodiment in that the second switching element 120 is connected over the plurality of storage elements 100, and the third switching element 130 is connected to each of the plurality of storage elements 100. The other constitutions are the same as those of the magnetic memory 300 according to the first embodiment, and the description thereof will be omitted.

In FIG. 9, the first switching element 110 and the third switching element 130 are connected between each of the storage elements 100 and the write wirings Wp1 to Wpn or the common wiring Cm1. The second switching element 120 is connected to one end of each of the read wirings Rp1 to Rpn connected to each of the storage elements 100. In FIG. 10, the second switching element 120 is located, for example, in the depth direction (the −y direction) of the drawing.

As shown in FIG. 10, the first conductive part 41 of the first storage element 100A is connected to the two transistors Tr. Further, the second conductive part 42 of the second storage element 100B is connected to the same two transistors Tr. The first switching element 110 connected to the first conductive part 41 of one storage element 100 also serves as the third switching element 130 connected to the second conductive part 42 of another storage element 100. When the transistor Tr connected to the first conductive part 41 of the first storage element 100A and the transistor Tr connected to the second conductive part 42 of the second storage element 100B are the same, no distinction is made between the first switching element 110 and the third switching element 130. It can also be said that the second conductive part 42 is electrically connected to the plurality of third switching elements 130.

Figure 11:
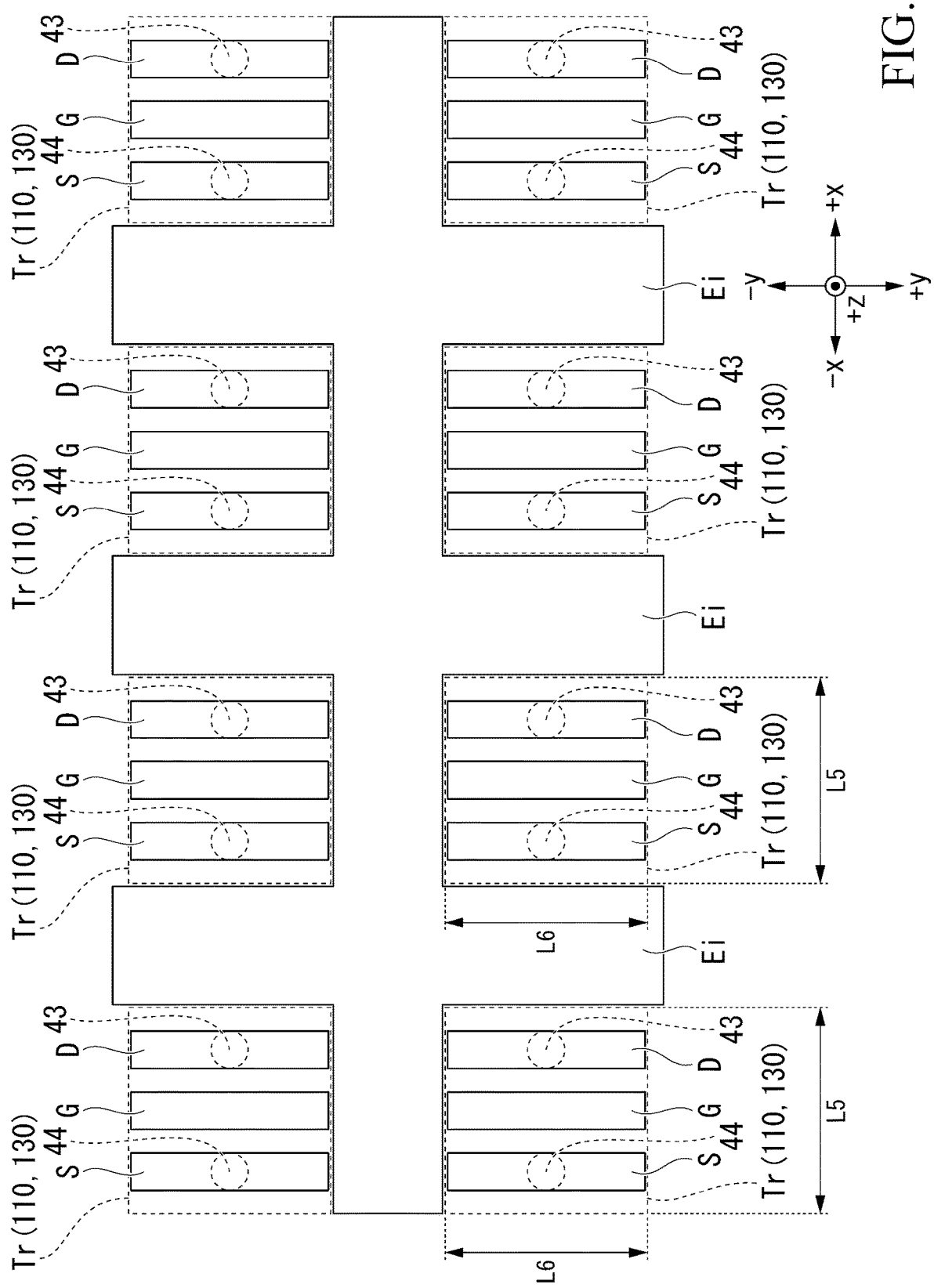
FIG. 11 is a plan view of a substrate of the magnetic memory according to the second embodiment.

FIG. 11 is a plan view of the substrate Sub of the magnetic memory 301 according to the second embodiment. The transistors Tr are arranged in the x direction and the y direction with an inter-element insulating part Ei interposed therebetween. Lengths L5 of the transistors Tr in the x direction are determined by the processing dimensions of the source region S, the gate electrode G, and the drain region D. The length L5 of each of the transistors Tr in the x direction is substantially the same. Also, lengths L6 of the transistors Tr in the y direction are substantially the same.

Figure 12:
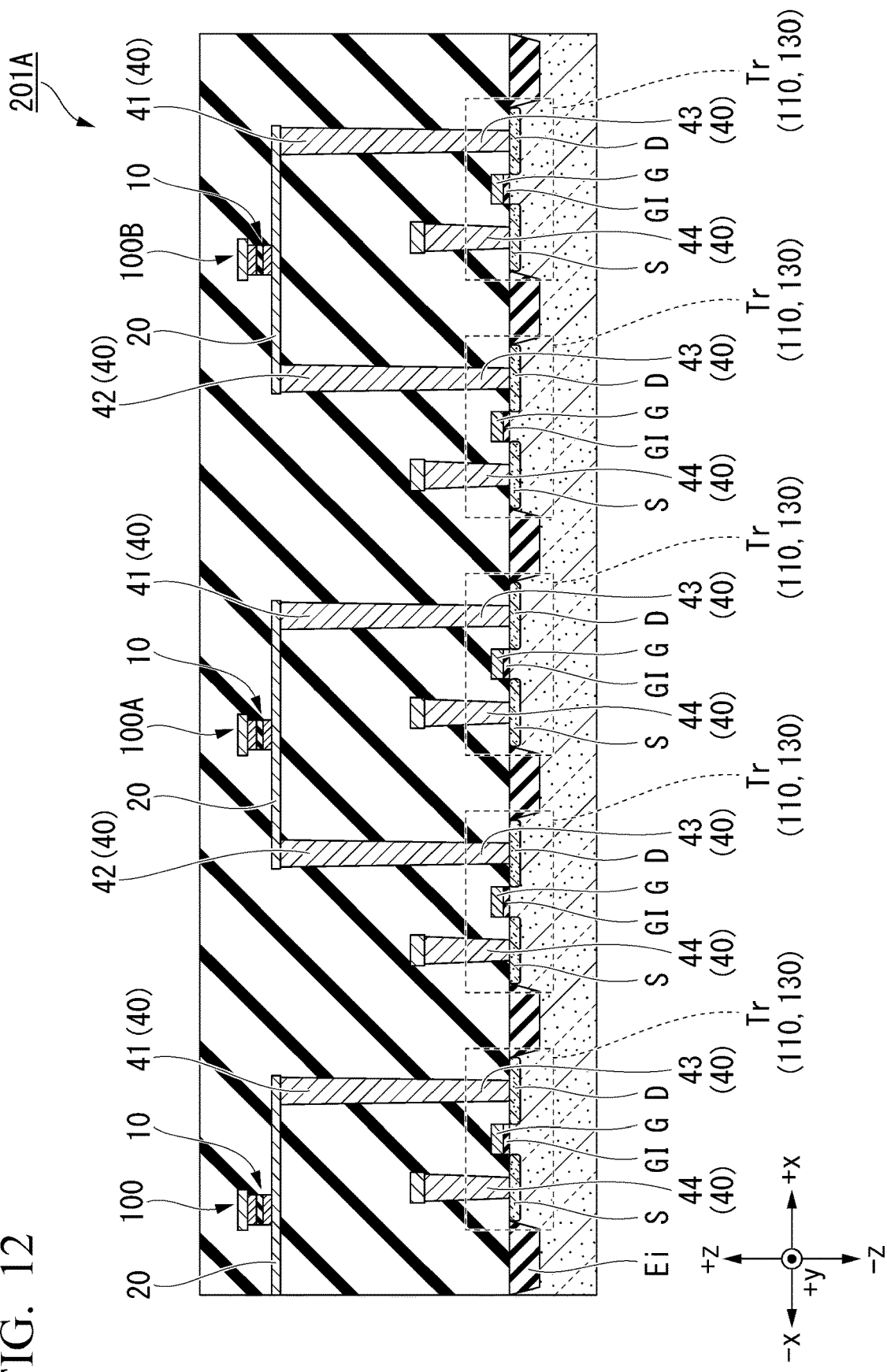
FIG. 12 is a cross-sectional view of a main part of a magnetic memory according to Comparative Example 2.
Figure 13:
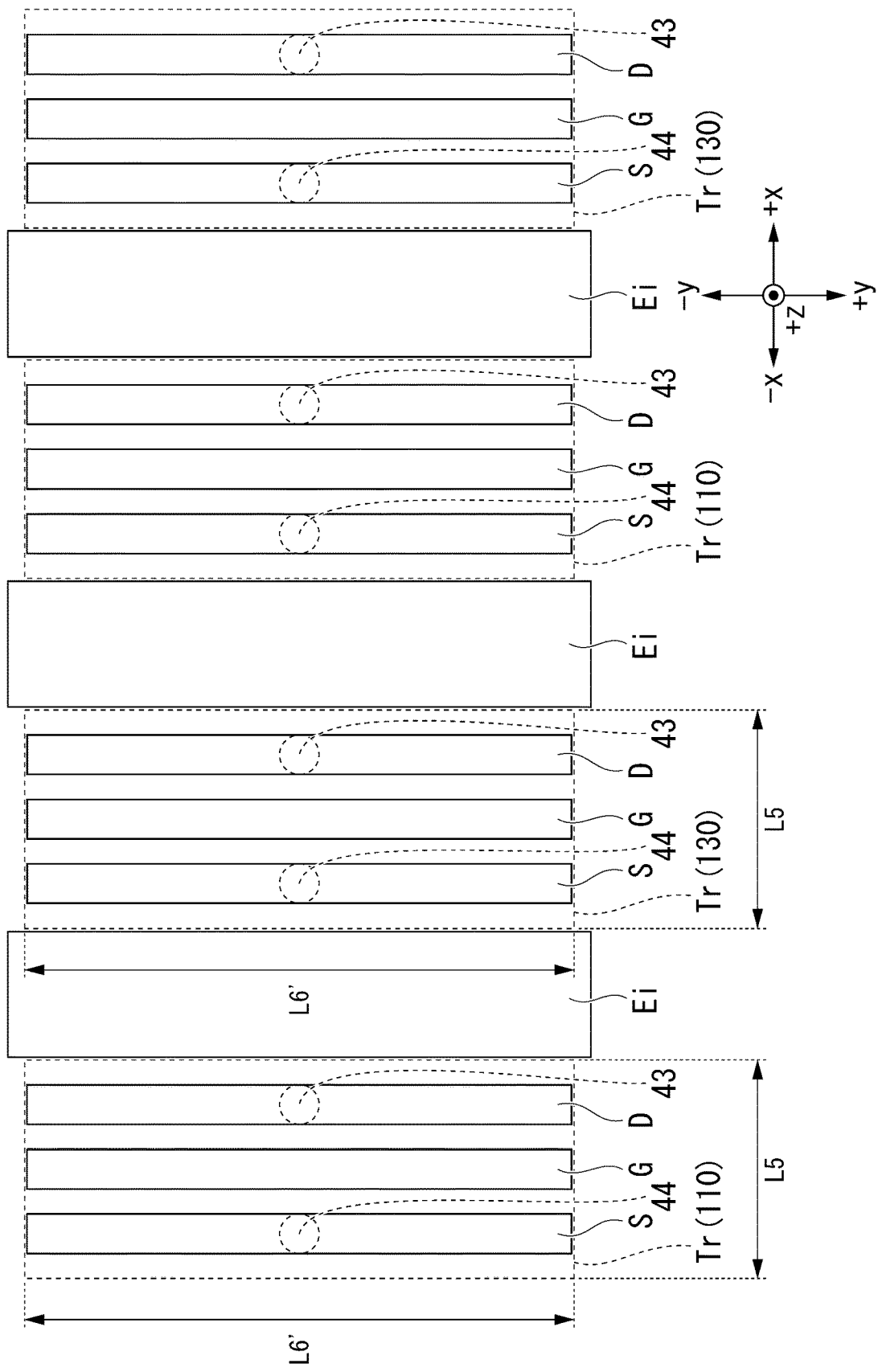
FIG. 13 is a plan view of a substrate of the magnetic memory according to Comparative Example 2.

FIG. 12 is a cross-sectional view of a main part (a semiconductor device 201A) of a magnetic memory according to Comparative Example 2. FIG. 13 is a plan view of a substrate of the magnetic memory according to Comparative Example 2. The semiconductor device 201A according to Comparative Example 2 is different from the magnetic memory according to the second embodiment in that the number of switching elements connected to each of the first conductive part 41 and the second conductive part 42 is one. Other constitutions are the same, and the same reference numerals are given to the same constitutions.

In the magnetic memory according to Comparative Example 2, the number of transistors Tr connected to each of the first conductive part 41 and the second conductive part 42 is one. An amount of current flowing through one transistor Tr in Comparative Example 2 is larger than the amount of current flowing through each of the transistors Tr of the magnetic memory 301 according to the second embodiment. This is because, in the magnetic memory 301 according to the second embodiment, each of the first conductive part 41 and the second conductive part 42 is connected to the plurality of transistors Tr, and the write current is divided by the plurality of transistors Tr.

The amount of current which can flow by each of the transistors Tr is determined by the maximum rated current value of the transistor Tr. The maximum rated current value of each of the transistors Tr in Comparative Example 2 is larger than the maximum rated current value of each of the transistors Tr in the second embodiment. That is, a length L6' of the transistor Tr in the y direction in Comparative Example 2 is longer than the length L6 of the transistor Tr in the y direction in the second embodiment. The magnetic memory according to Comparative Example 2 has an area required to operate one storage element 100 larger than that of the magnetic memory 301 according to the second embodiment. In other words, the magnetic memory 301 according to the second embodiment has more excellent integration characteristics than the magnetic memory according to Comparative Example 2.

Third Embodiment

Figure 14:
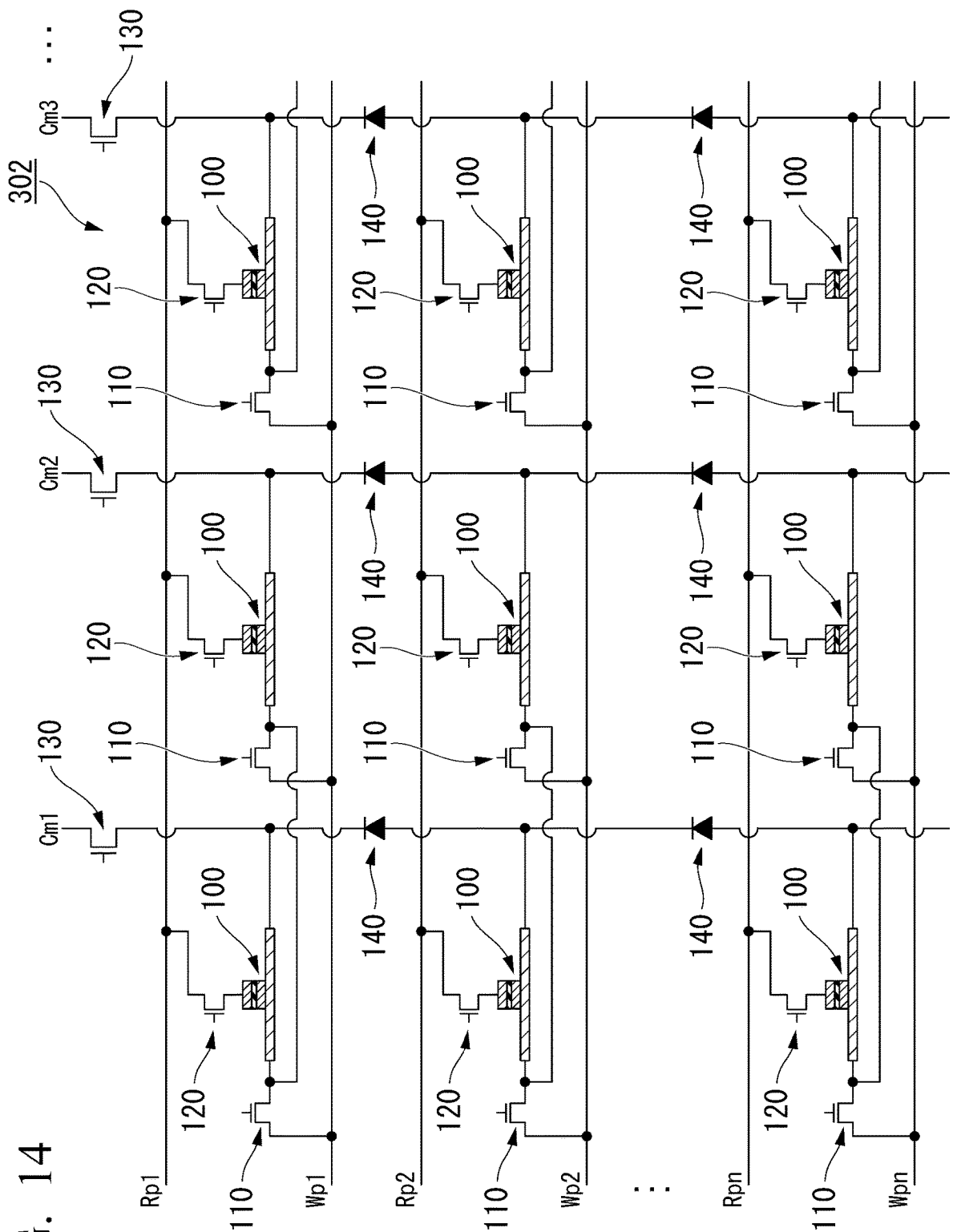
FIG. 14 is a schematic view of a magnetic memory according to a third embodiment.
Figure 15:
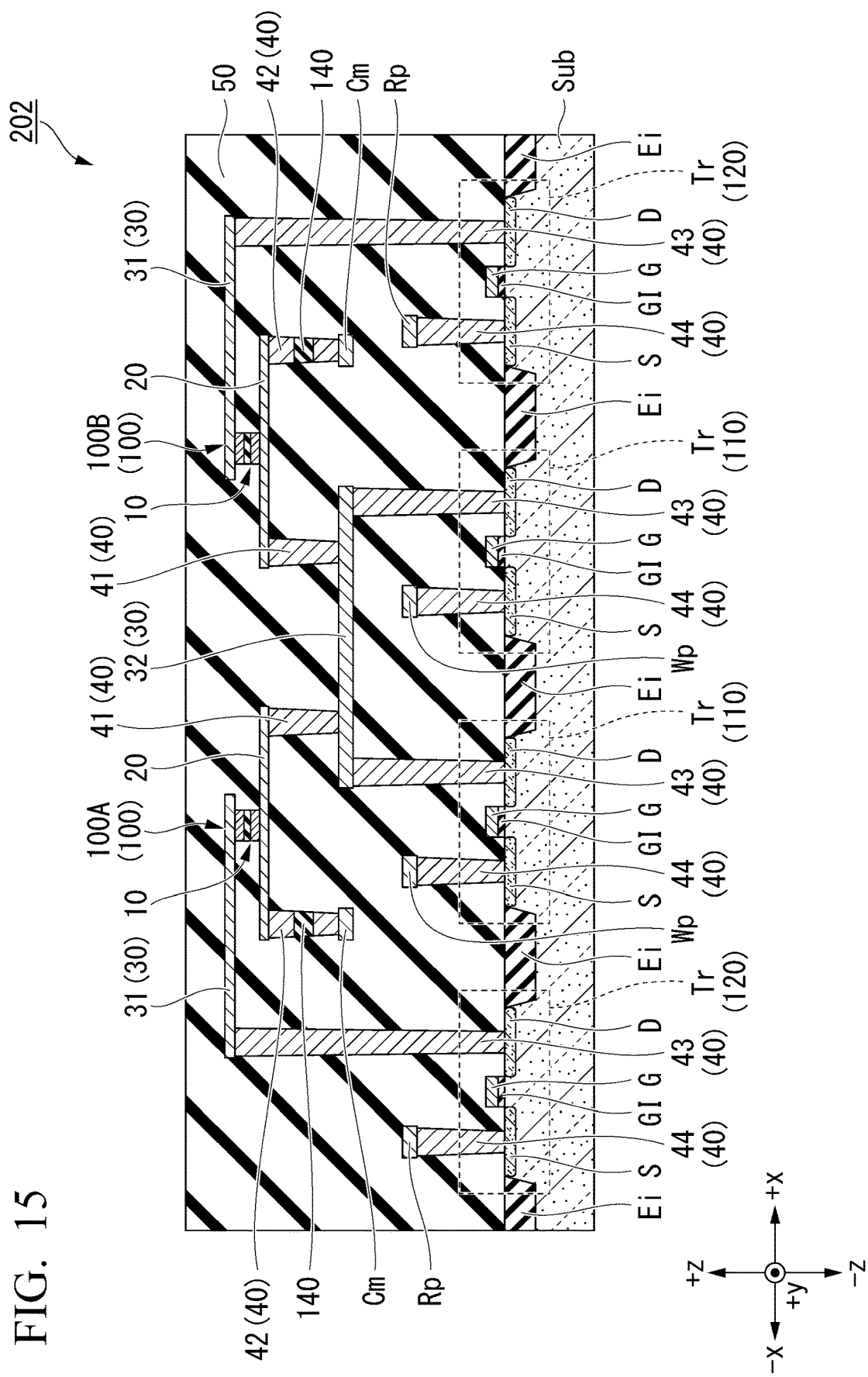
FIG. 15 is a cross-sectional view of a main part of the magnetic memory according to the third embodiment.

FIG. 14 is a view schematically illustrating an example of constitution of a magnetic memory 302 according to a third embodiment. FIG. 15 is a cross-sectional view of a main part (a semiconductor device 202) of the magnetic memory 302 according to the third embodiment. FIG. 15 is a cross section of the storage element 100 taken along the xz plane which passes through the center of the width of the first conductive layer 20 in the y direction. The magnetic memory 302 according to the third embodiment is different from the magnetic memory 300 according to the first embodiment in that it has a rectifier 140. The other constitutions are the same as those of the magnetic memory 300 according to the first embodiment, and the description thereof will be omitted.

The rectifier 140 is provided in the common wirings Cm1 to Cmn connected to the third switching element 130 in FIG. 14. The third switching element 130 in FIG. 14 is an example of a common switching element. The common wirings Cm1 to Cmn in FIG. 14 are an example of wirings which connect the common switching element to the plurality of storage elements 100. The rectifier 140 is provided between the adjacent storage elements 100 of the common wirings Cm1 to Cmn. The rectifier 140 is provided in the second conductive part 42 which connects the common wiring Cm to the first conductive layer 20, as shown in FIG. 15, for example.

The rectifier 140 is, for example, an element which uses a phase change of a crystal layer, such as a diode and an ovonic threshold switch (OTS), an element which uses a change in a band structure, such as a metal-insulator transition (MIT) switch, an element which uses a breakdown voltage, such as a Zener diode and an avalanche diode, and an element of which the conductivity changes according to a change in atomic positions.

Figure 16:
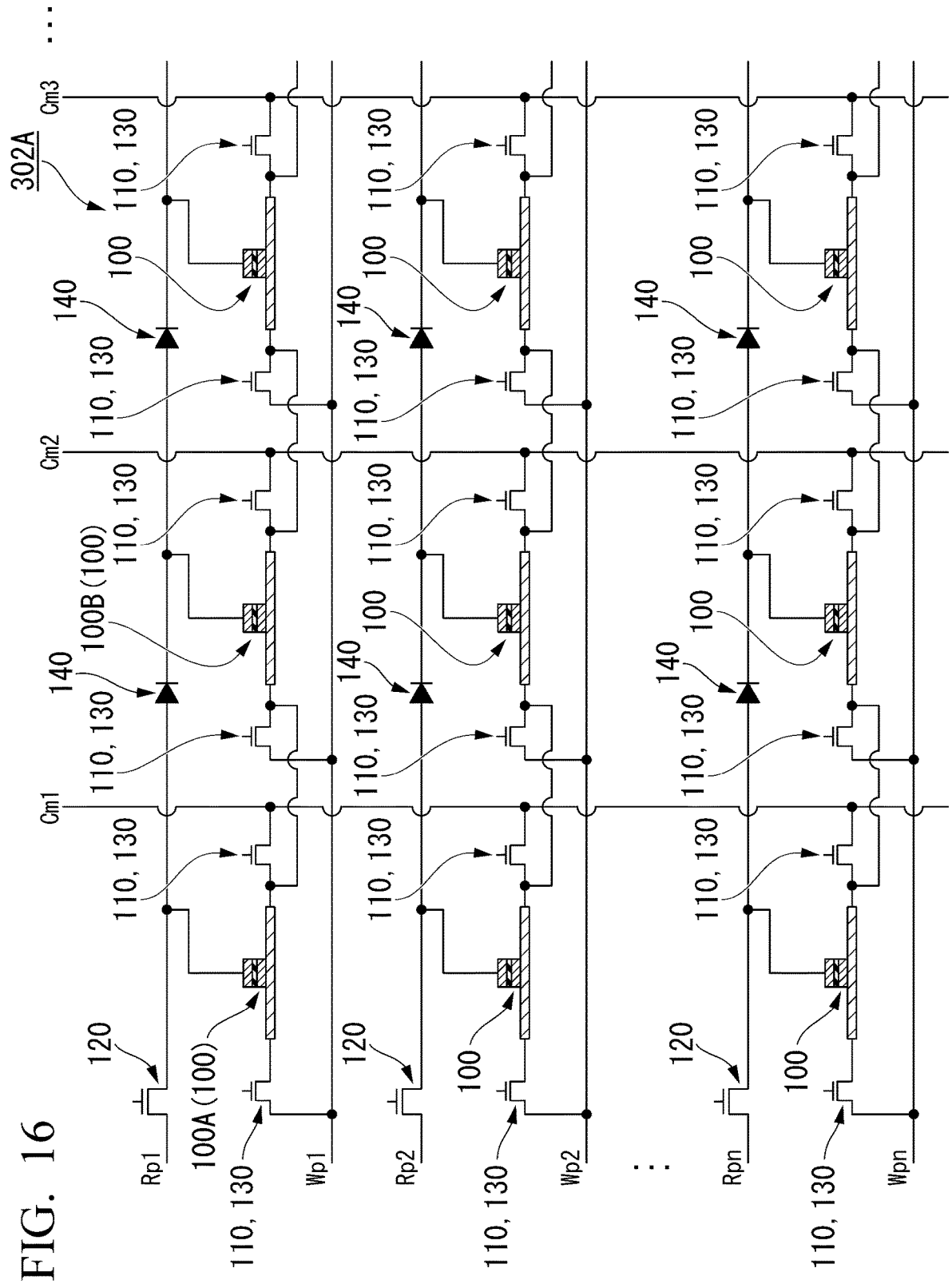
FIG. 16 is a schematic view of a magnetic memory according to another example of the third embodiment.
Figure 17:
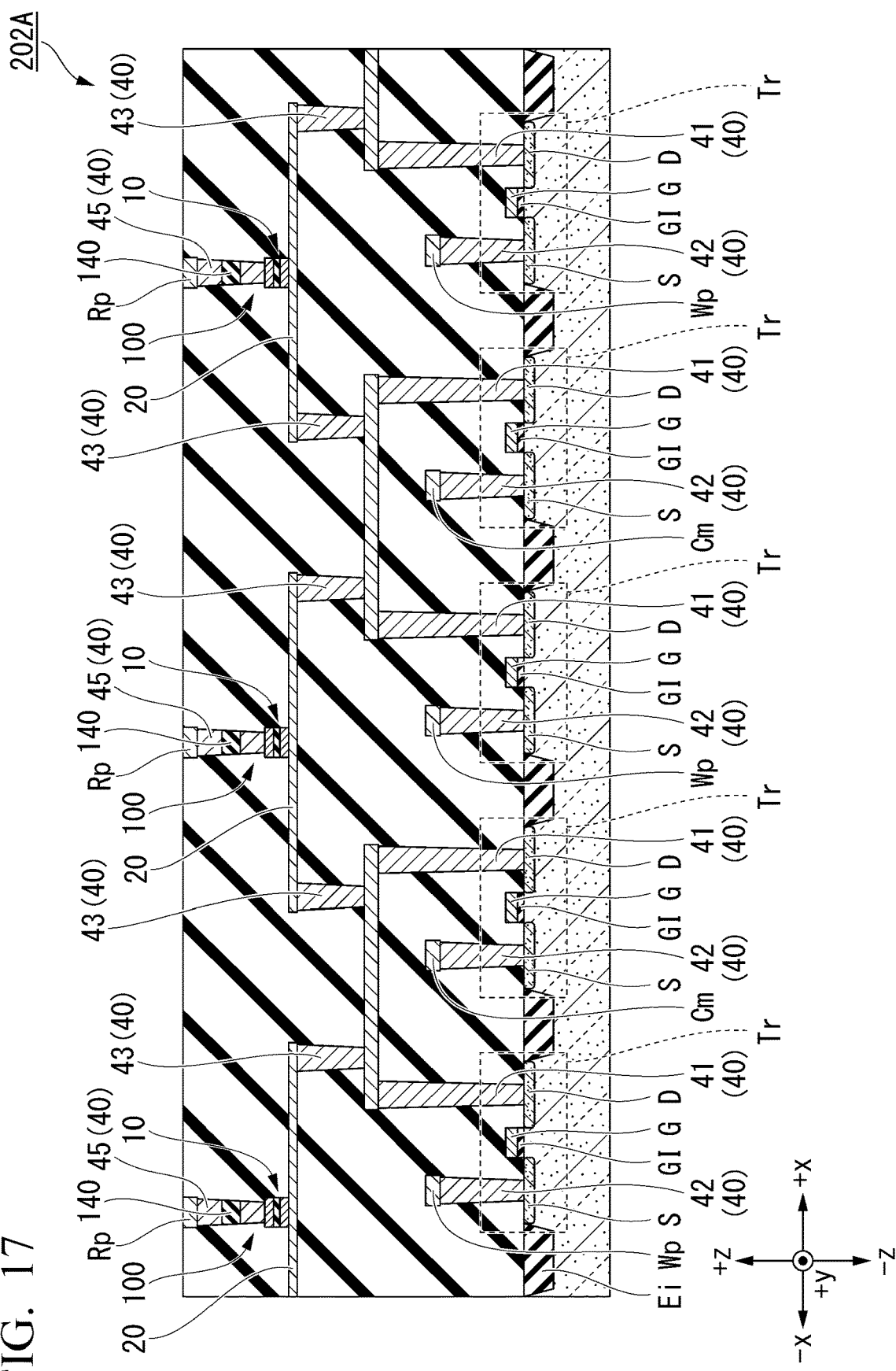
FIG. 17 is a cross-sectional view of a main part of the magnetic memory according to another example of the third embodiment.

Further, FIG. 16 is a view schematically illustrating an example of constitution of a magnetic memory 302A according to another example of the third embodiment. FIG. 17 is a cross-sectional view of a main part (a semiconductor device 202A) of the magnetic memory 302A according to another example of the third embodiment. FIG. 17 is a cross section of the storage element 100 taken along the xz plane which passes through the center of the width of the first conductive layer 20 in the y direction. The magnetic memory 302A is the magnetic memory 301 according to the second embodiment in which the rectifier 140 is provided. The rectifier 140 is provided in the read wirings Rp1 to Rpn connected to the second switching elements 120 in FIG. 16. The second switching element 120 in FIG. 16 is an example of a common switching element. The read wirings Rp1 to Rpn in FIG. 16 are examples of wirings which connect the common switching element to the plurality of storage elements 100. The rectifier 140 is provided between the adjacent storage elements 100 of the read wirings Rp1 to Rpn. The rectifier 140 is provided in a fifth conductive part 45 which connects the read wiring Rp to the first conductive layer 20, as shown in FIG. 17, for example.

The rectifier 140 controls a flowing direction of a current. The rectifier 140 curbs occurrence of leakage of a current in other storage elements 100 when the write current or the read current is applied to a predetermined storage element 100, and prevents erroneous writing and the like.

Further, in the magnetic memories 302 and 302A according to the third embodiment, a plurality of the first switching elements 110 are connected to the first conductive part 41. Therefore, the magnetic memories 302 and 302A according to the third embodiment have the same effects as the magnetic memories 300 and 301 according to the first and second embodiments.

Fourth Embodiment

Figure 18:
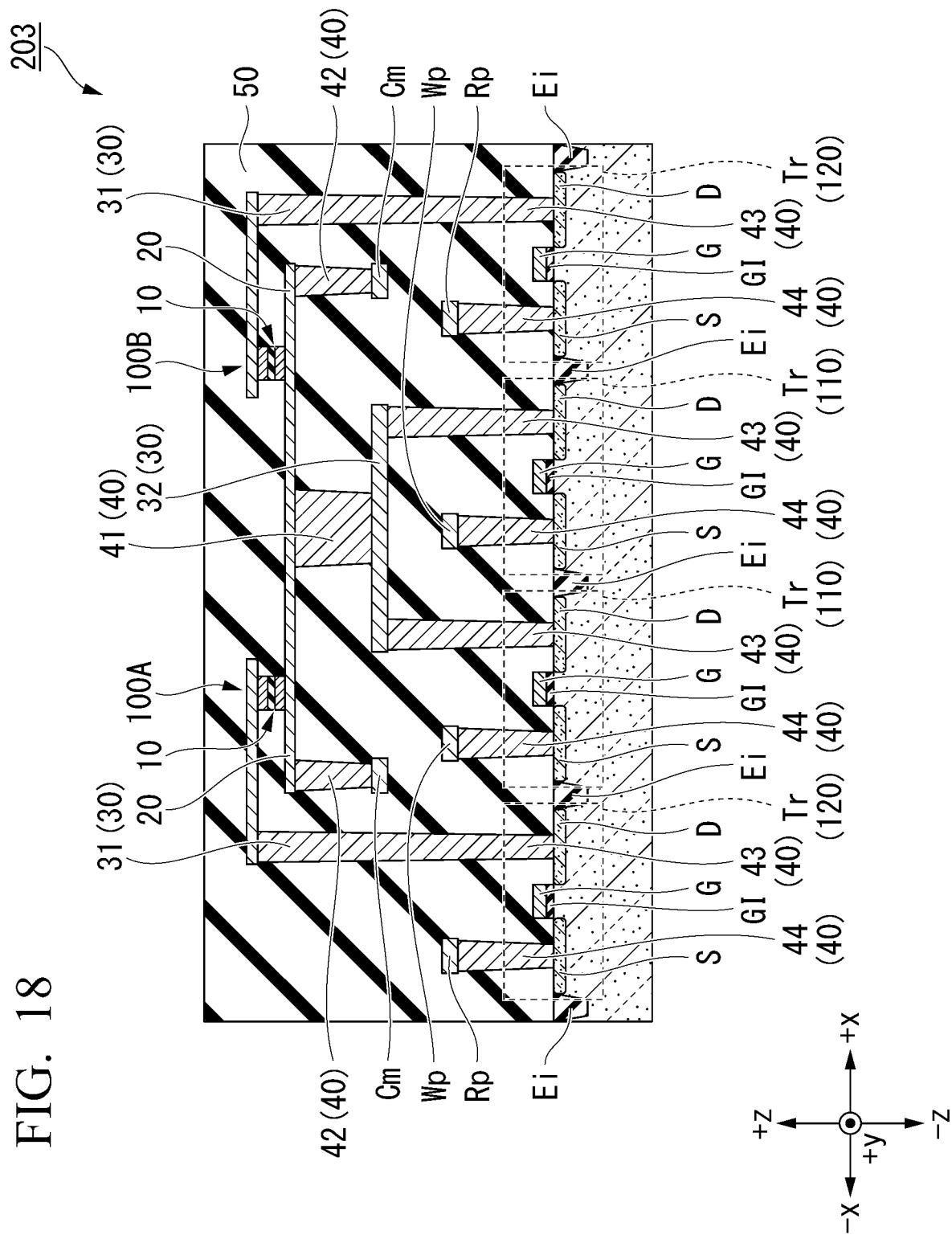
FIG. 18 is a cross-sectional view of a main part of a magnetic memory according to a fourth embodiment.

FIG. 18 is a cross-sectional view of a main part (a semiconductor device 203) of a magnetic memory according to a fourth embodiment. FIG. 18 is a cross section of the storage element 100 taken along the xz plane which passes through the center of the width of the first conductive layer 20 in the y direction. The magnetic memory according to the fourth embodiment is different from the main part (the semiconductor device 200) of the magnetic memory shown in FIG. 2 in that the first conductive part 41 of two storage elements 100 is shared. The other constitutions are the same as those of the magnetic memory 300 according to the first embodiment, and the description thereof will be omitted.

The first conductive part 41 of the first storage element 100A is the same as the first conductive part 41 of the second storage element 100B and is shared with each other. Further, the first conductive layer 20 extends, for example, from the second conductive part 42 of the first storage element 100A to the second conductive part 42 of the second storage element 100B. The first storage element 100A and the second storage element 100B share the first conductive layer 20, for example. The first storage element 100A and the second storage element 100B may share only the first conductive part 41 and may not share the first conductive layer 20.

The write current is supplied from, for example, two third conductive parts 43, merges at the first conductive part 41 and branches into the two second conductive parts 42. An amount of current flowing through the first conductive part 41 may be larger than the amount of current flowing through the second conductive part 42 and the third conductive part 43. Therefore, the outer peripheral length or diameter of the first conductive part 41 is preferably larger than the outer peripheral length or diameter of the second conductive part 42 and the third conductive part 43.

Further, in the magnetic memory according to the fourth embodiment, a plurality of the first switching elements 110 is connected to the first conductive part 41. Therefore, the magnetic memory according to the fourth embodiment has the same effect as the magnetic memory 300 according to the first embodiment. Further, a distance between the two storage elements 100 can be reduced by sharing the first conductive part 41 between the two storage elements 100. As the distance between the two storage elements 100 is closer to each other, the integration characteristics of the magnetic memory can be improved.

Fifth Embodiment

Figure 19:
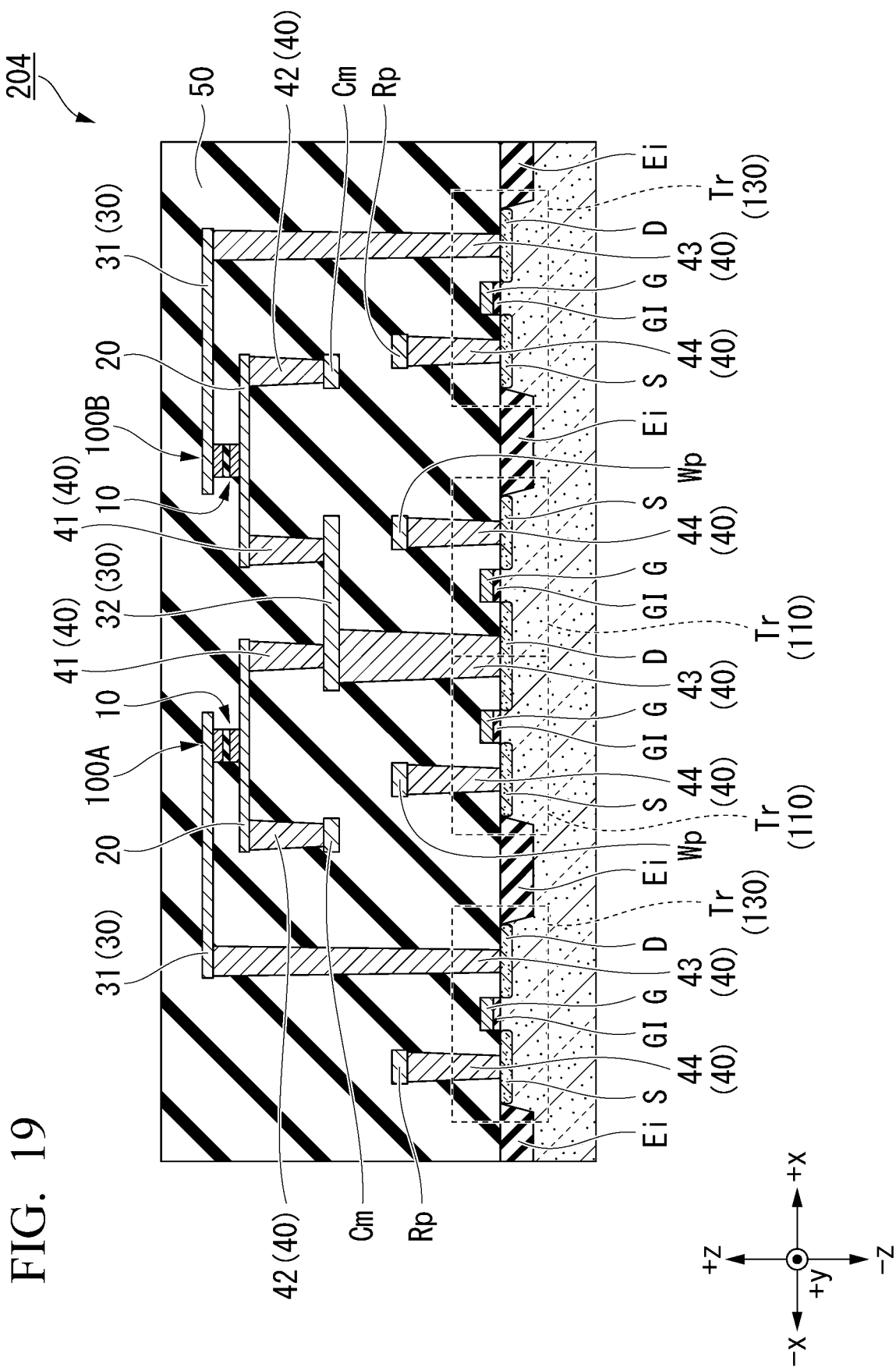
FIG. 19 is a cross-sectional view of a main part of a magnetic memory according to a fifth embodiment.

FIG. 19 is a cross-sectional view of a main part (a semiconductor device 204) of a magnetic memory according to a fifth embodiment. FIG. 19 is a cross section of the storage element 100 taken along the xz plane which passes through the center of the width of the first conductive layer 20 in the y direction. The magnetic memory according to the fifth embodiment is different from the main part (a semiconductor device 200) of the magnetic memory shown in FIG. 2 in that the third conductive part 43 connected to the conductive layers 32 of the two storage elements 100 is shared and there is no inter-element insulating part Ei between the first switching elements 110. The other constitutions are the same as those of the magnetic memory 300 according to the first embodiment, and the description thereof will be omitted.

The first conductive part 41 is connected to the two first switching elements 110. The two first switching elements 110 are not separated by the inter-element insulating part Ei and share the drain region D, for example. The two source regions S sandwich the drain region D in the x direction. A gate electrode G and a gate insulating film GI are provided between each of the source regions S and the drain region D. A width of the drain region D in the x direction is wider than a width of the source region S in the x direction, for example.

The third conductive part 43 connected to the conductive layer 32 is connected over the drain regions D of the two transistors Tr. The third conductive part 43 connected to the conductive layer 32 is shared by the first storage element 100A and the second storage element 100B.

The write current branches from the third conductive part 43 or merges toward the third conductive part 43. The amount of current flowing through the third conductive part 43 may be larger than the amount of current flowing through the first conductive part 41 and the second conductive part 42. Therefore, the outer peripheral length or the diameter of the third conductive part 43 is preferably larger than the outer peripheral length or the diameter of each of the first conductive part 41 and the second conductive part 42.

The magnetic memory according to the fifth embodiment has a plurality of first switching elements 110 connected to the first conductive part 41. Therefore, the magnetic memory according to the fifth embodiment has the same effect as the magnetic memory 300 according to the first embodiment. Further, the two first switching elements 110 share the drain region D, and thus the inter-element insulating part Ei can be partially removed. Furthermore, a distance between the two storage elements 100 can be reduced by sharing the third conductive part 43. As the distance between the two storage elements 100 is closer to each other, the integration characteristics of the magnetic memory can be further improved.

Heretofore, specific examples according to the first to fifth embodiments have been described in detail. The present disclosure is not limited to these examples, and various modifications and changes can be made within the scope of the gist of the present disclosure described in the claims. For example, the characteristic constitutions according to the first to fifth embodiments may be combined. Further, the constitution of the storage element according to the first embodiment to the fifth embodiment may be changed to the following modified examples.

Modified Example 1

Figure 20:
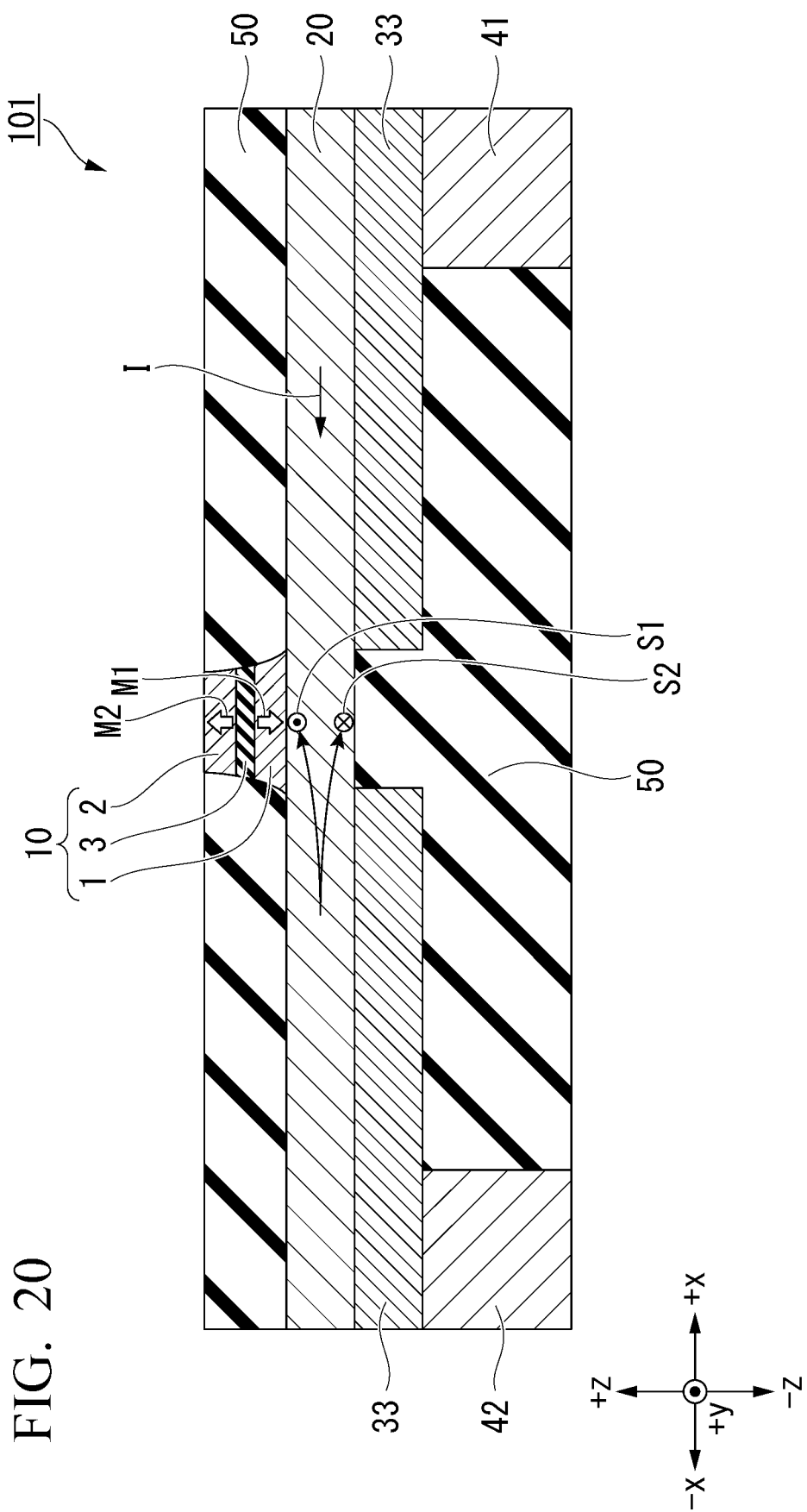
FIG. 20 is a cross-sectional view of a storage element according to Modified example 1.

FIG. 20 is a cross-sectional view of a storage element 101 according to Modified example 1. FIG. 20 is a cross section taken along the xz plane which passes through the center of the width of the first conductive layer 20 in the y direction. The storage element 101 according to Modified Example 1 is different from the storage element 100 shown in FIG. 4 in that the conductive layer 33 is provided between the first conductive layer 20 and the first conductive part 41 and the second conductive part 42. Other constitutions are the same as those of the storage element 100 shown in FIG. 4, and the description thereof will be omitted.

The conductive layer 33 has higher conductivity than the first conductive layer 20. The conductive layer 33 includes, for example, copper, aluminum and silver. For the first conductive layer 20, a heavy metal or the like is often selected as a material which produces a large spin orbit interaction. The conductivity of the first conductive layer 20 containing a heavy metal is inferior to that of the conductive layer 33. Heat generation of the first conductive layer 20 can be curbed by providing the conductive layer 33 between the first conductive layer 20 and the first conductive part 41 and the second conductive part 42.

The conductive layer 33 is not provided at a position in which it overlaps the first ferromagnetic layer 1 in a plan view in the z direction. The conductive layer 33 is separated at the position in which it overlaps the first ferromagnetic layer 1 in the plan view in the z direction. The write current flowing through the conductive layer 33 merges with the write current flowing through the first conductive layer 20 at the position in which it overlaps the first ferromagnetic layer 1 in the plan view in the z direction. As a result, it is possible to increase a current density of the write current flowing in the position in which it overlaps the first ferromagnetic layer 1 in the plan view in the z direction. The magnetization M1 of the first ferromagnetic layer 1 is reversed when a reversal current density is exceeded. The increase in the current density at the position in which it overlaps the first ferromagnetic layer 1 facilitates the reversal of the magnetization M1.

Modified Example 2

Figure 21:
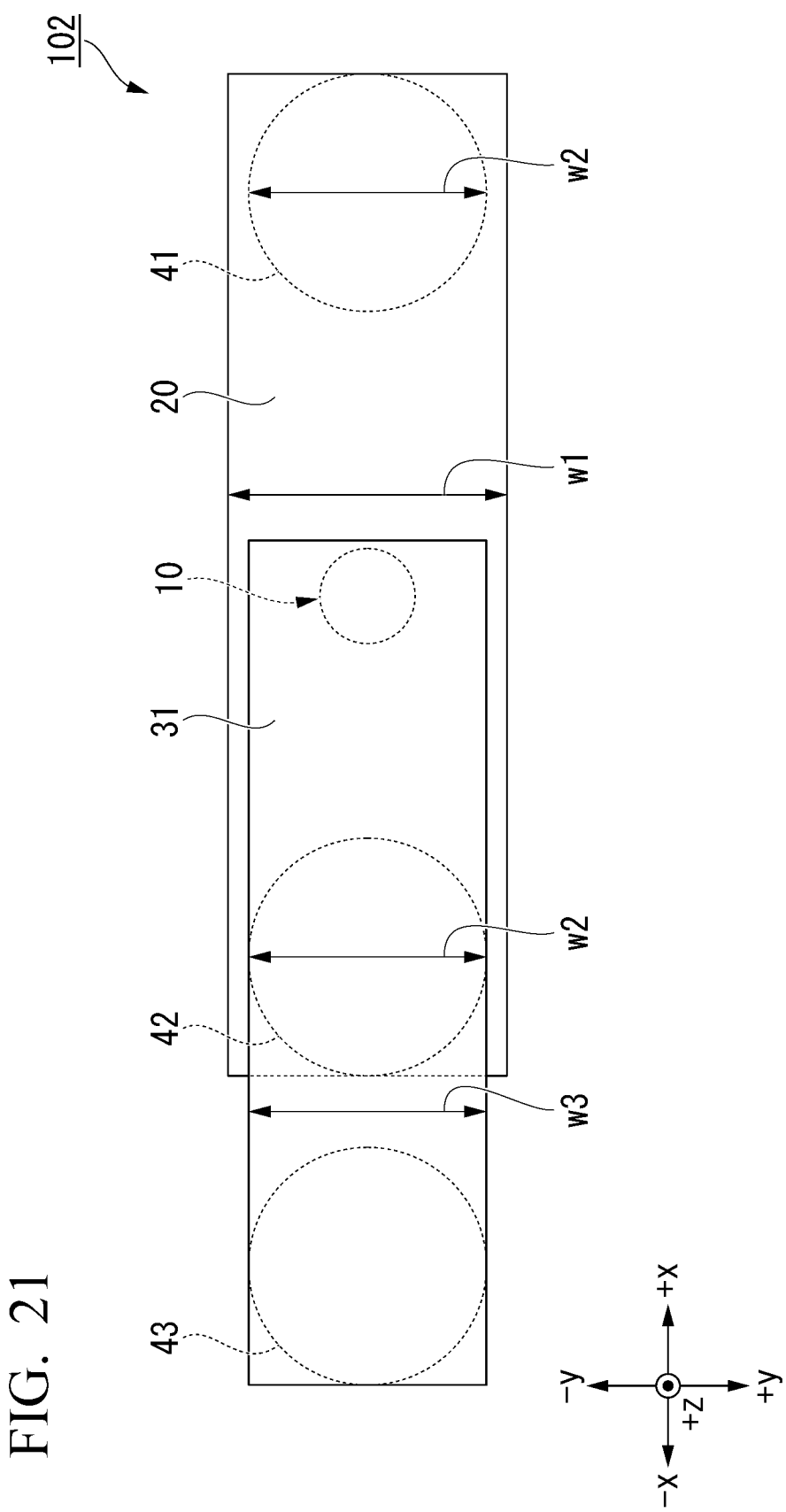
FIG. 21 is a cross-sectional view of a storage element according to Modified example 2.

FIG. 21 is a plan view of the storage element 102 according to Modified example 2. The storage element 102 according to Modified example 2 is different from the storage element 100 shown in FIG. 5 in a width w1 of the first conductive layer 20 in the y direction. Other constitutions are the same as those of the storage element 100 shown in FIG. 5, and thus the description thereof will be omitted.

The width w1 of the first conductive layer 20 in the y direction is longer than the width w2 of the first conductive part 41 and the second conductive part 42 in the y direction and the width w3 of the conductive layer 31. Since the width w1 of the first conductive layer 20 is longer than the width w2 of the first conductive part 41 and the second conductive part 42, the electrical connection between the first conductive layer 20 and the first conductive part 41 and the second conductive part 42 becomes smooth.

Modified Example 3

Figure 22:
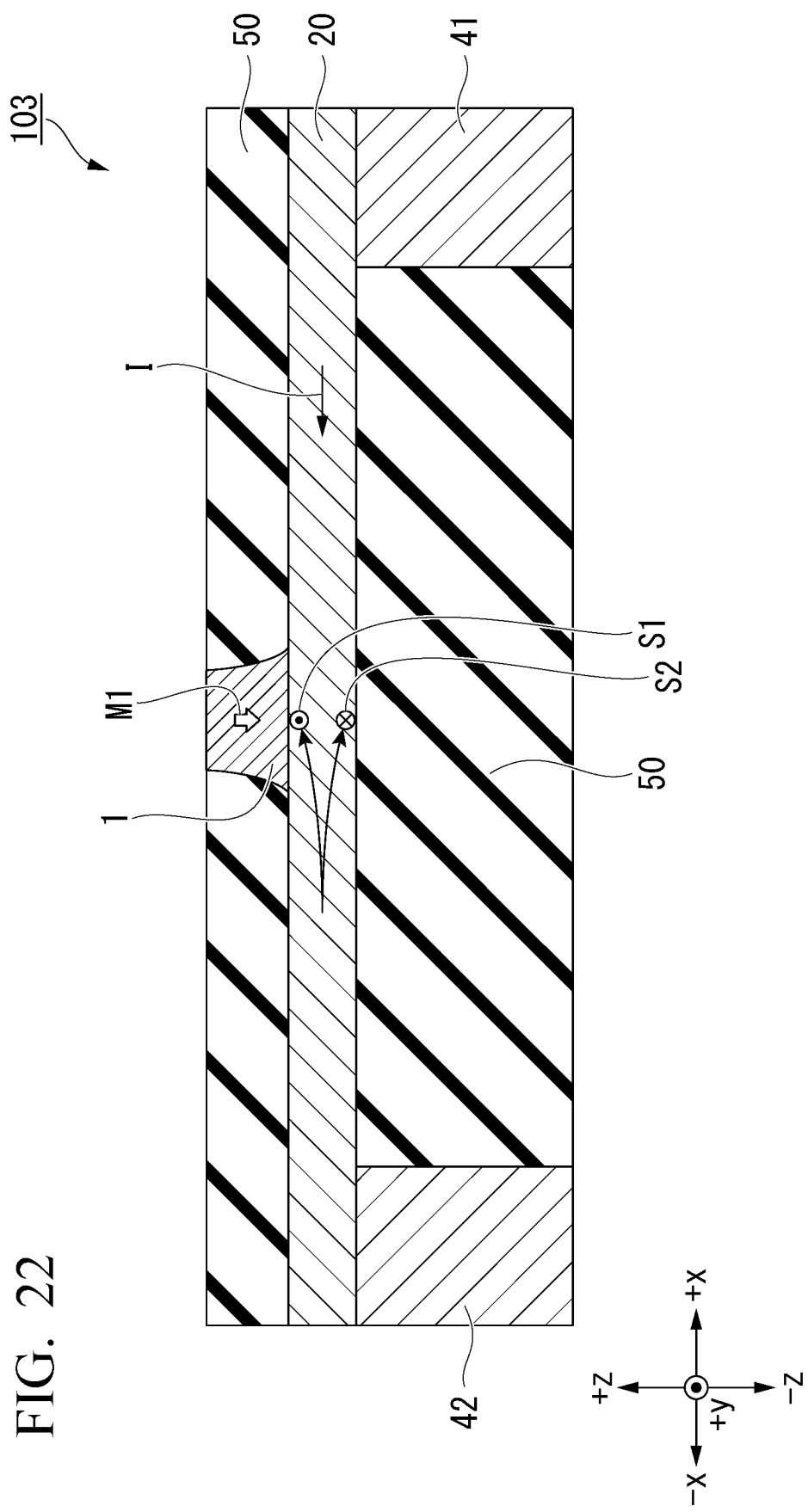
FIG. 22 is a cross-sectional view of a storage element according to Modified example 3.

FIG. 22 is a cross-sectional view of a storage element 103 according to Modified example 3. FIG. 22 is a cross section of the storage element 103 taken along the xz plane which passes through the center of the width of the first conductive layer 20 in the y direction. The storage element 103 according to Modified example 3 is different from the storage element 100 shown in FIG. 4 in that the storage element 103 does not have the nonmagnetic layer 3 and the second ferromagnetic layer 2. Other constitutions are the same as those of the storage element 100 shown in FIG. 4, and the description thereof will be omitted.

The storage element 103 can be used alone as an optical element using an anisotropic magnetic sensor, a Magnetic Kerr effect, or a Magnetic Faraday effect.

Modified Example 4

Figure 23:
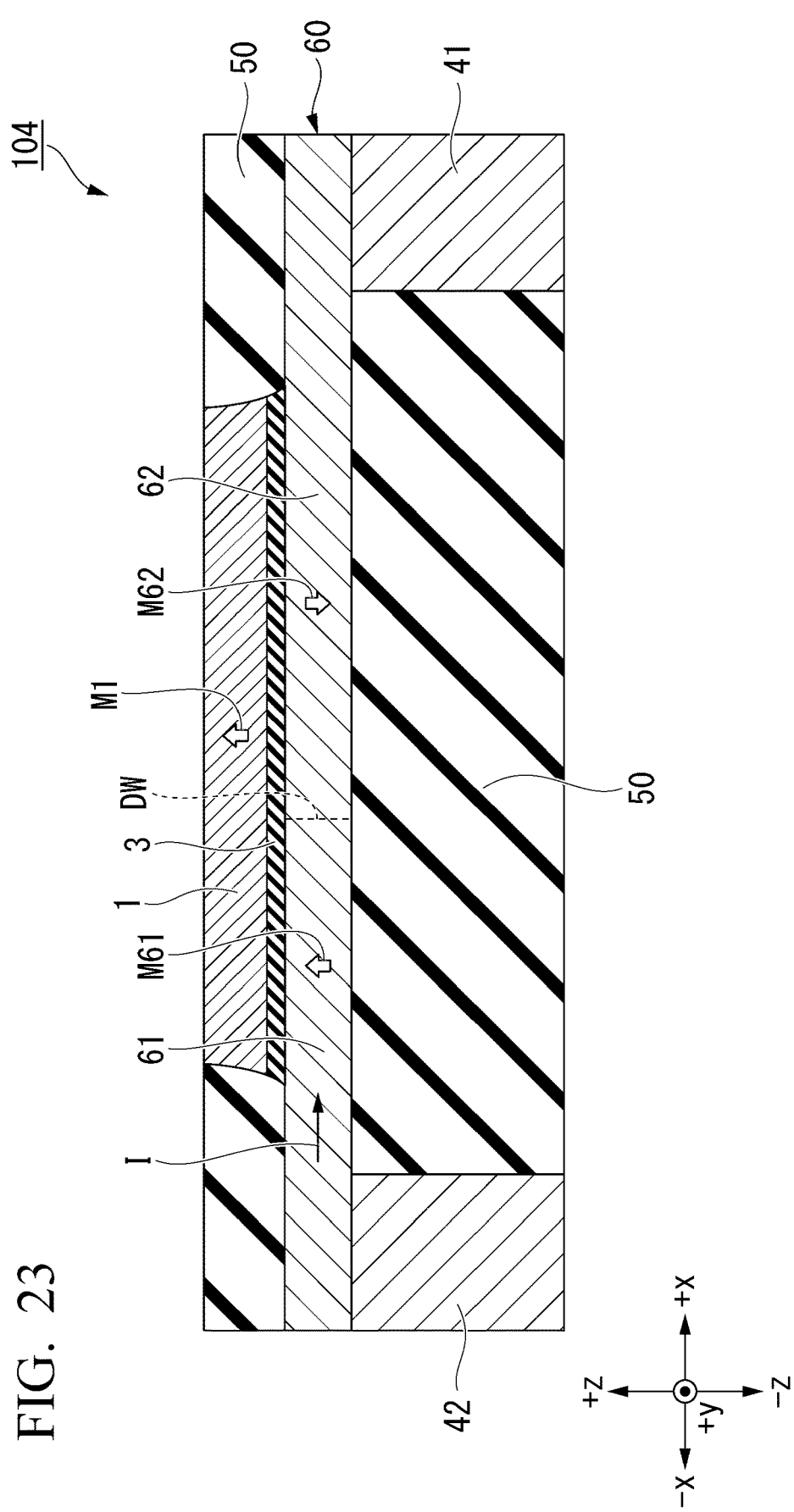
FIG. 23 is a cross-sectional view of a storage element according to Modified example 4.

FIG. 23 is a cross-sectional view of a storage element 104 according to Modified example 4. FIG. 23 is a cross section of the storage element 104 taken along the xz plane which passes through the center of the width of the first conductive layer 20 in the y direction. The storage element 104 according to Modified example 4 is different from the storage element 100 shown in FIG. 4 in that, instead of the magnetoresistance effect element 10, the first ferromagnetic layer 1 and the nonmagnetic layer 3 are provided on the first conductive layer 20. Other constitutions are the same as those of the storage element 100 shown in FIG. 4, and the description thereof will be omitted.

The storage element 104 has the first ferromagnetic layer 1, the nonmagnetic layer 3, a first conductive layer 60, the first conductive part 41, and the second conductive part 42. The first ferromagnetic layer 1 sandwiches the nonmagnetic layer 3 in the z direction together with the first conductive layer 60. The first conductive part 41 and the second conductive part 42 are connected to the first conductive layer 60 at positions at which they sandwich the first ferromagnetic layer 1 and the nonmagnetic layer 3 in the x direction. The storage element 104 is an element of which a resistance value changes with displacement of the magnetic domain wall and may be referred to as a magnetic domain wall displacement element or a domain wall displacement type magnetoresistance effect element.

The first conductive layer 60 extends in the x direction. The first conductive layer 60 is a magnetic layer which faces the first ferromagnetic layer 1 with the nonmagnetic layer 3 interposed therebetween.

The first conductive layer 60 includes a ferromagnetic material. A magnetic material constituting the first conductive layer 60 can use a metal selected from the group consisting of Cr, Mn, Co, Fe and Ni, an alloy containing one or more of these metals, an alloy containing these metals and at least one or more elements of B, C and N, or the like. Specifically, Co—Fe, Co—Fe—B, and Ni—Fe may be used.

The first conductive layer 60 preferably includes at least one element selected from the group consisting of Co, Ni, Pt, Pd, Gd, Tb, Mn, Ge, and Ga. Examples of the material used for the first conductive layer 60 include a laminated film of Co and Ni, a laminated film of Co and Pt, a laminated film of Co and Pd, a MnGa-based material, a GdCo-based material, and a TbCo-based material. Ferrimagnetic materials such as a MnGa-based material, a GdCo-based material, and a TbCo-based material have small saturation magnetization, and a threshold current required to move the magnetic domain wall DW becomes small. Further, the laminated film of Co and Ni, the laminated film of Co and Pt, and the laminated film of Co and Pd have a large coercivity and a slow magnetic domain wall moving speed.

The first conductive layer 60 is a layer on which information can be magnetically recorded by a change in an internal magnetic state. The first conductive layer 60 has a first magnetic domain 61 and a second magnetic domain 62 therein. The magnetization M61 of the first magnetic domain 61 and the magnetization M62 of the second magnetic domain 62 are oriented in opposite directions, for example. A boundary between the first magnetic domain 61 and the second magnetic domain 62 is the magnetic domain wall DW. The first conductive layer 60 can have the magnetic domain wall DW therein. In the first conductive layer 60 shown in FIG. 23, the magnetization M61 of the first magnetic domain 61 is oriented in the +z direction, and the magnetization M62 of the second magnetic domain 62 is oriented in the −z direction.

The storage element 104 can record data in multiple values or continuously according to a position of the magnetic domain wall DW of the first conductive layer 60. The data recorded in the first conductive layer 60 is read as a change in the resistance value of the storage element 104 when the read current is applied.

A ratio of the first magnetic domain 61 to the second magnetic domain 62 in the first conductive layer 60 changes as the magnetic domain wall DW moves. The magnetization M1 of the first ferromagnetic layer 1 is, for example, in the same direction as (parallel to) the magnetization M61 of the first magnetic domain 61 and in the opposite direction (antiparallel) to the magnetization M62 of the second magnetic domain 62. When the magnetic domain wall DW moves in the +x direction and an area of the first magnetic domain 61 in a portion which overlaps the first ferromagnetic layer 1 in the plan view in the z direction increases, the resistance value of the storage element 104 decreases. On the contrary, when the magnetic domain wall DW moves in the −x direction and an area of the second magnetic domain 62 in a portion which overlaps the first ferromagnetic layer 1 in the plan view in the z direction increases, the resistance value of the storage element 104 increases.

The magnetic domain wall DW moves by causing the write current to flow in the x direction of the first conductive layer 60 or by applying an external magnetic field. For example, when the write current (for example, a current pulse) is applied to the first conductive layer 60 in the +x direction, electrons flow in the −x direction which is the opposite of the current, and thus the magnetic domain wall DW moves in the −x direction. When a current flows from the first magnetic domain 61 toward the second magnetic domain 62, the electrons spin-polarized in the second magnetic domain 62 reverse the magnetization M61 of the first magnetic domain 61. When the magnetization M61 of the first magnetic domain 61 is reversed, the magnetic domain wall DW moves in the −x direction.

The first ferromagnetic layer 1 and the nonmagnetic layer 3 are the same as those of the storage element 100 according to the first embodiment. A thickness of the nonmagnetic layer 3 in the storage element 104 is preferably 20 Å or more, more preferably 30 Å or more. When the thickness of the nonmagnetic layer 3 is large, a resistance area product (RA) of the storage element 104 becomes large. The resistance area product (RA) of the storage element 104 is preferably $1 \times 10^5$ $\Omega \mu m^2$ or more, more preferably $1 \times 10^6$ $\Omega \mu m^2$ or more. The resistance area product (RA) of the storage element 104 is represented by a product of element resistance of one storage element 104 and an element cross-sectional area of the storage element 104 (an area of a cut surface obtained by cutting the nonmagnetic layer 3 in the xy plane).

Here, the magnetic domain wall displacement type elements are shown as another example of the storage element. The storage element is not limited to these examples. The storage element may be any element having a first current path through which a current flows in a laminating direction of the first ferromagnetic layers 1 and a second current path through which a current flows in a direction which intersects the laminating direction of the first ferromagnetic layers 1.

The magnetic memories having the storage element according to Modified examples 1 to 4 are different only in the specific constitution of the storage element, and the number of the first switching elements 110 connected to the first conductive part 41 is plural. Therefore, even when the storage elements according to Modified examples 1 to 4 are used, the integration characteristics of the magnetic memories according to the first to fifth embodiments can be improved.

EXPLANATION OF REFERENCES

1 First ferromagnetic layer
2 Second ferromagnetic layer
3 Nonmagnetic layer
10 Magnetoresistance effect element
20, 60 First conductive layer
30, 31, 32, 33 Conductive layer
40 Conductive part
41 First conductive part
42 Second conductive part
43 Third conductive part
44 Fourth conductive part
50 Insulating layer
61 First magnetic domain
62 Second magnetic domain
100, 101, 102, 103, 104 Storage element
100A First storage element
100B Second storage element
110, 110A, 110B First switching element
120 Second switching element
130, 130A Third switching element
140 Rectifier
200, 200A, 201, 201A, 202, 202A, 203, 204 Semiconductor device
300, 301, 302, 302A Magnetic memory

What is claimed is:
1. A magnetic memory comprising:
a storage element including
a first ferromagnetic layer,
a first conductive layer which faces the first ferromagnetic layer in a first direction and extends in a second direction different from the first direction, and
a first conductive part and a second conductive part which are connected to the first conductive layer at positions which sandwich the first ferromagnetic layer in the second direction when seen in the first direction; and
a plurality of first switching elements which are electrically connected to the first conductive part of the storage element.
2. The magnetic memory according to claim 1, wherein the number of the first switching elements is two.
3. The magnetic memory according to claim 1, wherein:
a plurality of storage elements are provided,
a first storage element and a second storage element of the plurality of storage elements are connected to the same plurality of first switching elements, and
the first storage element and the second storage element share the plurality of first switching elements.
4. The magnetic memory according to claim 3, wherein:
the first conductive part of the first storage element and the first conductive part of the second storage element are the same, and
the first storage element and the second storage element share the first conductive part.
5. The magnetic memory according to claim 3, wherein:
each of the plurality of first switching elements is a transistor,
each of the transistors has a gate electrode, and a source region and a drain region which sandwich the gate electrode,
a third conductive part which is connected over the drain region of each of the transistors is provided, and
the first conductive part of the first storage element and the second storage element is electrically connected to the third conductive part.
6. The magnetic memory according to claim 1, comprising:
a plurality of storage elements,
a common switching element which is connected over the plurality of storage elements,
a wiring which connects the common switching element to the plurality of storage elements, and
a rectifier which is provided between adjacent storage elements of the wiring.
7. The magnetic memory according to claim 1, further comprising a second switching element which is connected to the first ferromagnetic layer,
wherein a maximum rated current value of each of the plurality of first switching elements is larger than a maximum rated current value of the second switching element.
8. The magnetic memory according to claim 1, further comprising a second switching element which is connected to the first ferromagnetic layer,
wherein, when seen in the first direction, a length of the second switching element in a third direction which intersects the second direction is substantially the same as a length of each of the plurality of first switching elements in the third direction.
9. The magnetic memory according to claim 1, further comprising a plurality of third switching elements which are electrically connected to the second conductive part of the storage element.
10. The magnetic memory according to claim 1, wherein:
a plurality of storage elements are provided, and
the second conductive part of the second storage element is connected to the plurality of first switching elements connected to the first storage element.
11. The magnetic memory according to claim 1, wherein the first conductive layer includes any one of a metal, an alloy, an intermetallic compound, a metal boride, a metal carbide, a metal silicide, and a metal phosphide which have a function of generating a spin current due to a spin Hall effect when a current flows.
12. The magnetic memory according to claim 1, further comprising a second ferromagnetic layer which is located on a side of the first ferromagnetic layer opposite to the first conductive layer, and a nonmagnetic layer which is located between the first ferromagnetic layer and the second ferromagnetic layer.
13. The magnetic memory according to claim 1, wherein:
the first conductive layer includes a ferromagnetic material, and a nonmagnetic layer is further provided between the first ferromagnetic layer and the first conductive layer.

14. A method for controlling a magnetic memory having a storage unit with a laminated first ferromagnetic layer and a first conductive layer, wherein the first ferromagnetic layer has a first surface (1) orthogonal to a lamination direction and (2) that faces a facing surface of the first conductive layer in the lamination direction, comprising applying current pulses having different current amounts stepwise to the first conductive layer to change a magnetization direction of the first ferromagnetic layer.

15. The method according to claim 14, wherein an application time of a first-stage current pulse of the current pulses is 5 nsec or more.

16. The method according to claim 14, wherein the storage element further comprises a nonmagnetic layer and a second ferromagnetic layer on the first ferromagnetic layer in the lamination direction such that the nonmagnetic layer is between the first ferromagnetic layer and the second ferromagnetic layer in the lamination direction, and wherein the method further comprises applying the current pulses having different current amounts stepwise to the first conductive layer to change a relative angle between the magnetization of the first ferromagnetic layer and the magnetization of the second ferromagnetic layer.

* * * * *